(12) United States Patent
Kahng et al.

(10) Patent No.: US 11,275,460 B2
(45) Date of Patent: Mar. 15, 2022

(54) DISPLAY DEVICE

(71) Applicant: Samsung Display Co., Ltd., Yongin-si (KR)

(72) Inventors: Changwoo Kahng, Hwaseong-si (KR); Dongik Koo, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/833,252

(22) Filed: Mar. 27, 2020

(65) Prior Publication Data

US 2020/0341576 A1 Oct. 29, 2020

(30) Foreign Application Priority Data

Apr. 26, 2019 (KR) .................. 10-2019-0048948

(51) Int. Cl.
*G06F 3/041* (2006.01)
*G06F 3/044* (2006.01)
*G06F 3/047* (2006.01)

(52) U.S. Cl.
CPC ............ *G06F 3/0412* (2013.01); *G06F 3/044* (2013.01); *G06F 3/047* (2013.01); *G06F 2203/04103* (2013.01); *G06F 2203/04105* (2013.01)

(58) Field of Classification Search
CPC . G06F 2203/04103; G06F 2203/04105; G06F 3/0412; G06F 3/044; G06F 3/047
See application file for complete search history.

(56) References Cited

U.S. PATENT DOCUMENTS

| 5,806,388 A * | 9/1998 | Imataki | ..................... B26D 7/08 83/13 |
| 10,133,391 B2 | 11/2018 | Kim | |
| 10,162,445 B2 | 12/2018 | Kim et al. | |
| 2008/0068342 A1* | 3/2008 | Chang | ..................... G06F 3/0412 345/173 |
| 2011/0291978 A1* | 12/2011 | Ho | ......................... G06F 3/0446 345/173 |
| 2014/0320759 A1* | 10/2014 | Jeong | ..................... G06F 1/1692 349/12 |

(Continued)

FOREIGN PATENT DOCUMENTS

| KR | 10-2017-0093627 A | 8/2017 |
| KR | 10-2017-0134629 A | 12/2017 |

(Continued)

OTHER PUBLICATIONS

International Search Report for corresponding International Application No. PCT/KR2020/005476, dated Apr. 24, 2020, 3 pages.

*Primary Examiner* — Hong Zhou
(74) *Attorney, Agent, or Firm* — Lewis Roca Rothgerber Christie LLP

(57) ABSTRACT

A display device includes a display panel, a first printed circuit board over one surface of the display panel and including a first pad and a second pad, a pressure sensor between the display panel and the first printed circuit board, the pressure sensor including a first conductor connected to the first pad, and a second conductor forming a capacitance with the first conductor, a first adhesive portion contacting the second pad and the second conductor, and a second adhesive portion contacting the second conductor and the first printed circuit board.

27 Claims, 11 Drawing Sheets

(56) References Cited

U.S. PATENT DOCUMENTS

| | | | |
|---|---|---|---|
| 2015/0050492 A1* | 2/2015 | Kim | C09J 7/20 |
| | | | 428/354 |
| 2015/0267089 A1* | 9/2015 | Niimi | C09J 133/08 |
| | | | 345/173 |
| 2016/0034087 A1* | 2/2016 | Kim | G06F 3/0445 |
| | | | 345/173 |
| 2016/0062516 A1* | 3/2016 | Jeong | G06F 1/1643 |
| | | | 345/174 |
| 2016/0147345 A1* | 5/2016 | Lee | G06F 1/1637 |
| | | | 345/173 |
| 2016/0291767 A1* | 10/2016 | Ding | G06F 3/0443 |
| 2018/0143716 A1 | 5/2018 | Choi et al. | |
| 2018/0203321 A1 | 7/2018 | Shin et al. | |
| 2018/0293420 A1 | 10/2018 | Kim et al. | |
| 2018/0307369 A1 | 10/2018 | Park et al. | |
| 2018/0321780 A1 | 11/2018 | Park et al. | |
| 2019/0102027 A1* | 4/2019 | Yoo | H01L 51/0097 |
| 2019/0138125 A1* | 5/2019 | Zeng | G06F 3/044 |
| 2021/0043694 A1* | 2/2021 | Wei | G06F 1/1637 |

FOREIGN PATENT DOCUMENTS

| | | |
|---|---|---|
| KR | 10-2018-0005321 A | 1/2018 |
| KR | 10-2018-0029220 A | 3/2018 |
| KR | 10-1835674 B1 | 3/2018 |
| KR | 10-2018-0116188 A | 10/2018 |
| KR | 10-2018-0118846 A | 11/2018 |
| KR | 10-2018-0123395 A | 11/2018 |
| KR | 10-1956295 B1 | 3/2019 |

\* cited by examiner

DISPLAY DEVICE

CROSS-REFERENCE TO RELATED APPLICATION

This application claims priority to and the benefit of Korean Patent Application No. 10-2019-0048948, filed on Apr. 26, 2019, in the Korean Intellectual Property Office (KIPO), the disclosure of which is incorporated by reference herein in its entirety.

BACKGROUND

1. Field

Aspects of the present invention relate to a display device.

2. Discussion of Related Art

A force touch-type display device may not only sense a touch when a screen is touched, but also sense a pressure of the touch on the screen. Accordingly, it is possible to provide a higher level of usability from a simple touch to the user interface (UI).

The force touch-type display device may sense a pressure through a sensor sheet inserted into a display panel, which, also, increases a thickness of a panel and increases manufacturing costs.

Recently, an all-in-one force touch scheme for reducing thickness by printing a pressure sensor electrode on a back surface of a display panel, without using a sensor sheet, has been developed.

In the all-in-one force touch scheme, a display panel on which a sensor electrode is printed and a printed circuit board are attached to each other by using a conductive tape.

However, when a pressure according to a force touch of a user is applied to a connection portion between a pressure sensor and the printed circuit board, the display panel may be bent, while the printed circuit board may not be bent due to its stiffness.

Accordingly, the conductive tape attached to the sensor electrode is detached from the printed circuit board, such that a signal sensed by the force touch sensor is not transmitted and signal detection cannot be performed normally.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Aspects of embodiments of the present invention are directed to a display device of an all-in-one force touch type in which force touch sensors are printed to a display panel, without using a sensor sheet, thus improved in terms of a connection between a printed circuit board and a force touch sensor.

According to some embodiments of the present invention, there is provided a display device including: a display panel; a first printed circuit board over one surface of the display panel and including a first pad and a second pad; a pressure sensor between the display panel and the first printed circuit board, the pressure sensor including a first conductor connected to the first pad, and a second conductor forming a capacitance with the first conductor; a first adhesive portion contacting the second pad and the second conductor; and a second adhesive portion contacting the second conductor and the first printed circuit board.

In some embodiments, the pressure sensor includes an elastic member between the display panel and the first printed circuit board, the first conductor is between the elastic member and the first printed circuit board, and the second conductor is between the elastic member and the display panel.

In some embodiments, the second adhesive portion is spaced apart from the first adhesive portion in a plan view.

In some embodiments, the second adhesive portion does not contact the second pad.

In some embodiments, the first adhesive portion is a conductive tape, and the second adhesive portion is a non-conductive tape.

In some embodiments, the first adhesive portion includes a conductive sponge contacting the second pad and the second conductor.

In some embodiments, the second adhesive portion has an adhesive force greater than an adhesive force of the first adhesive portion.

In some embodiments, an adhesive force between the second adhesive portion and the second conductor is greater than an adhesive force between the first adhesive portion and the second conductor.

In some embodiments, the first adhesive portion contacts the second pad, and the second adhesive portion contacts a cover layer of the first printed circuit board.

In some embodiments, the second adhesive portion has a c-like shape around the first adhesive portion on a plane.

In some embodiments, the first printed circuit board includes a wiring pad and is connected to the display panel through the wiring pad.

In some embodiments, the display device further includes: a touch sensor including at least one touch electrode over another surface of the display panel; a second printed circuit board connecting the touch sensor and the first printed circuit board; and a touch driving circuit mounted over the second printed circuit board.

In some embodiments, the display device further includes: a third printed circuit board attached to an end portion of the display panel; and a display panel driving circuit at an end portion of the display panel and providing a driving signal and an image signal to the display panel.

In some embodiments, the first printed circuit board is separated from the second printed circuit board or the third printed circuit board so as not to overlap each other.

In some embodiments, the first printed circuit board overlaps an area where the pressure sensor is located.

In some embodiments, the second printed circuit board or the third printed circuit board is located at an area other than where the pressure sensor is located.

In some embodiments, the first printed circuit board is connected to the second printed circuit board and the third printed circuit board through a wiring layer located at an area other than where the pressure sensor is located.

In some embodiments, the second adhesive portion includes: a filler including particles having a size of about 2 nm to about 500 nm; and a binder for fixing the filler.

In some embodiments, the filler includes at least one selected from the group consisting of $BaSO_4$, $TiO_2$, $SiO_2$, and carbon black.

In some embodiments, the binder includes at least one selected from the group consisting of acrylic resins and epoxy resins.

In some embodiments, the second adhesive portion has an adhesive force in a range from about 1.0 kgf/in to 3.0 kgf/in.

According to some embodiments of the present invention, there is provided a display device including: a display panel; a first printed circuit board over one surface of the display panel; a pressure sensor between the display panel and the first printed circuit board, the pressure sensor overlapping the first printed circuit board; a touch sensor over another surface of the display panel; a second printed circuit board connecting the first printed circuit board and the touch sensor; and a third printed circuit board connecting the first printed circuit board and the display panel, wherein the first printed circuit board overlaps an area where the pressure sensor is located, and wherein the second printed circuit board and the third printed circuit board are located at an area other than where the pressure sensor is located.

In some embodiments, the first printed circuit board includes a first pad and a second pad, and the pressure sensor includes: an elastic member between the display panel and the first printed circuit board; a first conductor between the elastic member and the first printed circuit board and connected to the first pad; and a second conductor between the elastic member and the display panel and forming a capacitance with the first conductor.

In some embodiments, the display device further includes a first adhesive portion contacting the second pad and the second conductor.

In some embodiments, the display device further includes a second adhesive portion contacting the second conductor and the first printed circuit board.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features of the present invention will become more apparent by describing in detail embodiments thereof with reference to the accompanying drawings, wherein.

DETAILED DESCRIPTION

Figure 1:
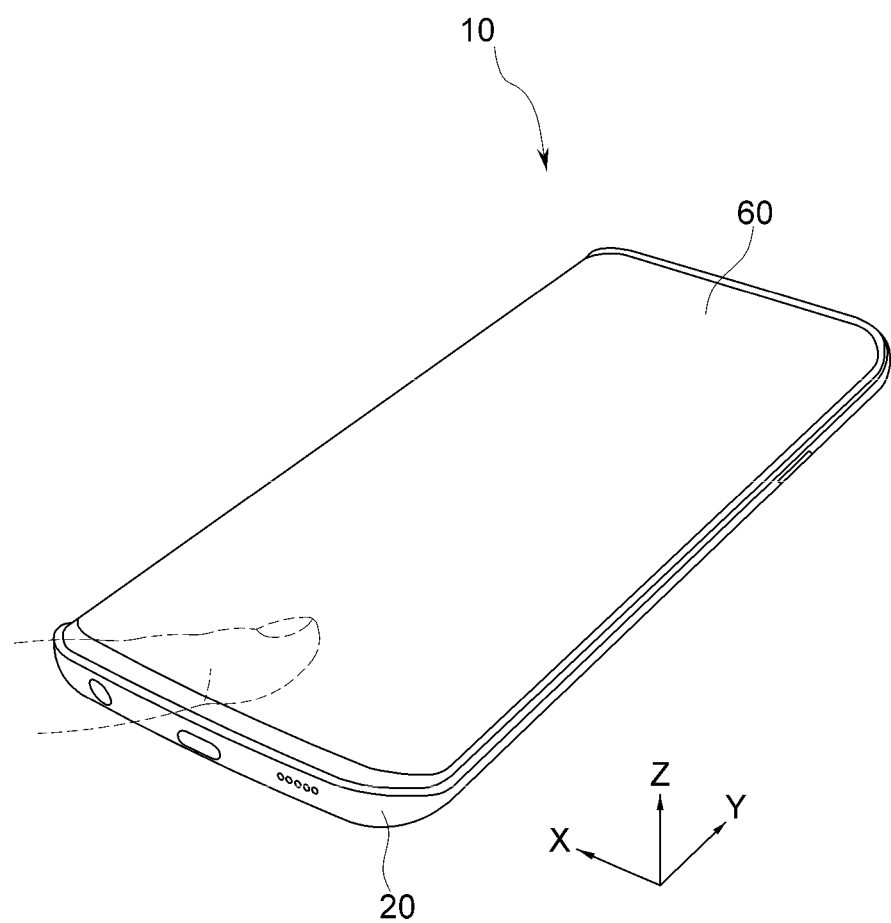
FIG. 1 is a perspective view illustrating a display device according to an embodiment of the present invention.

Embodiments of the present invention will now be described more fully hereinafter with reference to the accompanying drawings. Although the present invention may be modified in various suitable manners and have several embodiments, a number of embodiments are illustrated in the accompanying drawings and are described in the specification. However, the scope of the present invention is not limited to the embodiments and should be construed as including all the changes, equivalents, and substitutions included in the spirit and scope of the invention.

In the drawings, thicknesses of a plurality of layers and areas are illustrated in an enlarged manner for clarity and ease of description thereof. When a layer, area, or element is referred to as being "on" another layer, area, or element, it may be directly on the other layer, area, or element, or intervening layers, areas, or elements may be present therebetween. Similarly, when a layer, area, or element is referred to as being "over" another layer, area, or element, intervening layers, areas, or elements may be present therebetween or it may be directly on the other layer, area, or element. Conversely, when a layer, area, or element is referred to as being "directly on" another layer, area, or element, intervening layers, areas, or elements may be absent therebetween. Further when a layer, area, or element is referred to as being "below" another layer, area, or element, it may be directly below the other layer, area, or element, or intervening layers, areas, or elements may be present therebetween. Conversely, when a layer, area, or element is referred to as being "directly below" another layer, area, or element, intervening layers, areas, or elements may be absent therebetween.

The spatially relative terms "below," "beneath," "lower," "above," "over," "on," "upper" and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device located "below" or "beneath" another device may be placed "above" another device. Accordingly, the illustrative term "below" may include both the lower and upper positions. The device may also be oriented in the other direction and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "including," "includes" and/or "including," when used in this specification, specify the presence of stated features, integers, steps, operations, elements and/or components, but do not preclude the presence or addition of one or more other features, integers, steps, operations, elements, components and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of variation for the particular value as determined by one of ordinary skill in the art, considering the measurement in question and the error associated with measurement of the particular quantity (i.e., the limitations of the measurement system). For example, "about" may mean within one or more standard variations, or within ±30%, 20%, 10%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Some of the parts which are not associated with the description may not be provided for clarity sake. Like reference numerals refer to like elements throughout the specification.

Herein, display devices are assumed to be organic light emitting diode (OLED) display devices; however, embodiments of the present invention are not limited thereto. The display device according to an embodiment may be applied to a liquid crystal display (LCD) device or a plasma display device.

Hereinafter, embodiments of the present invention will be described with reference to FIGS. 1 to 19.

A display device 10 according to various embodiments of the present invention may include at least one of, for example, a smartphone, a tablet personal computer (PC), a mobile phone, a video phone, an e-book reader, a desktop PC, a laptop PC, a netbook computer, a workstation, a server, a personal digital assistant (PDA), a portable multimedia player (PMP), an MP3 player, a mobile medical apparatus, a camera, or a wearable device. According to various embodiments, the wearable device may be an accessory type (e.g., a watch, a ring, a bracelet, an anklet, a necklace, glasses, contact lenses or a head-mounted device (HMD)), a textile or clothing attached type (e.g., electronic apparel), a body attached type (e.g., skin pads or tattoos), a bio-implantable type (e.g., implantable circuits), or the like.

In various embodiments of the present invention, the display device 10 may be one of the various devices described above or a combination thereof. A display device according to an embodiment may be a flexible display device. In addition, a display device according to an embodiment is not limited to the above-described devices, and may include a new display device according to technological advancement.

Hereinafter, display devices according to various embodiments will be described with reference to the accompanying drawings. As used herein, the term "user" may refer to a person using the display device or a device using the display device (e.g., an artificial intelligence (AI) display device).

Figure 2:
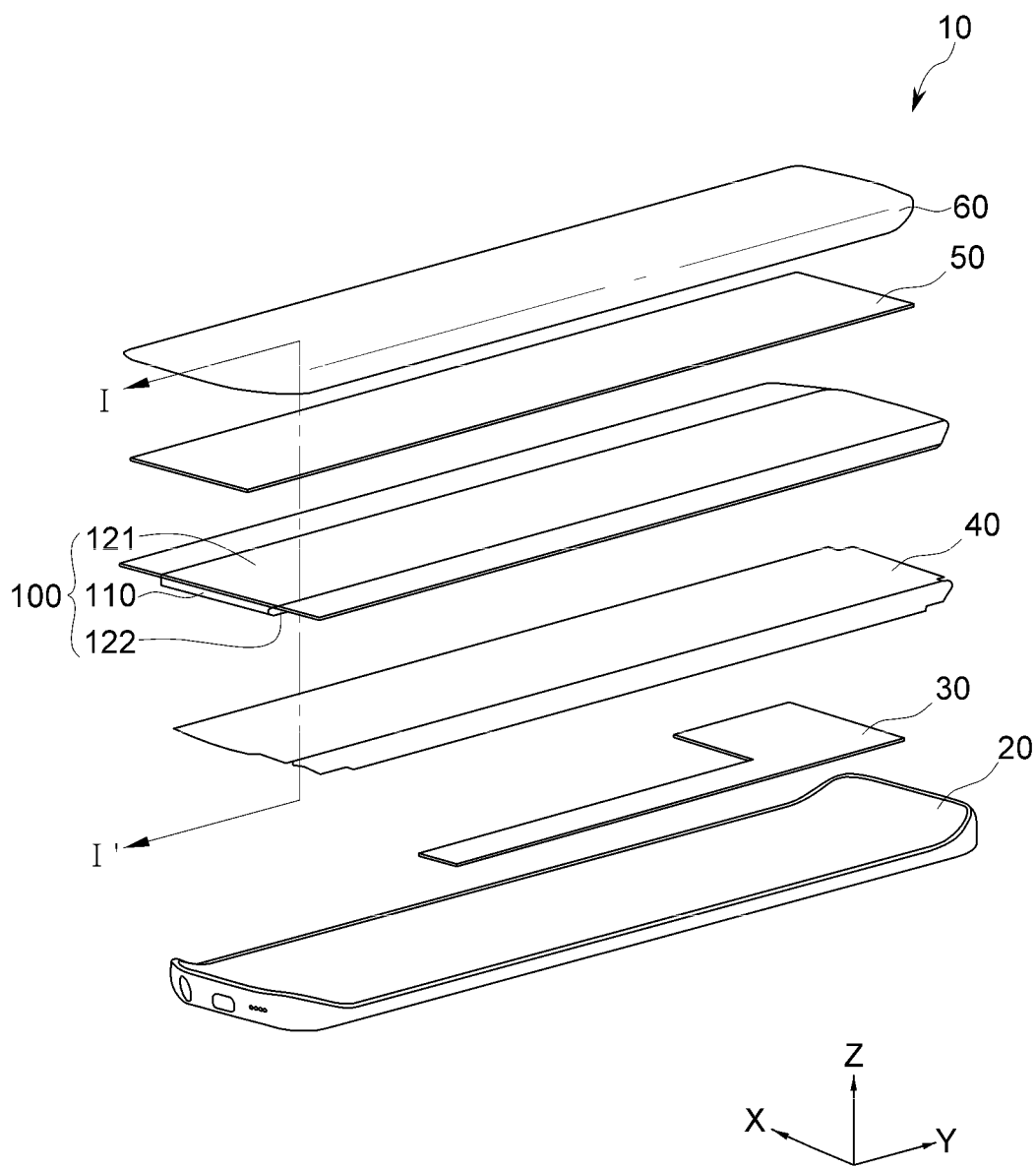
FIG. 2 is an exploded perspective view illustrating the display device illustrated in FIG. 1.

FIG. 1 is a perspective view illustrating a display device according to an embodiment. FIG. 2 is an exploded perspective view illustrating the display device illustrated in FIG. 1.

Referring to FIGS. 1 and 2, a display device 10 according to an embodiment includes a housing 20, a main circuit board 30, a bracket 40, a display panel 100, a polarization film 50, and a cover window 60. According to various embodiments, the display device 10 may not include some of configurations illustrated in FIGS. 1 and 2, or may further include configurations not illustrated in FIGS. 1 and 2.

The cover window 60 may transmit light generated by the display panel 100. In addition, on the cover window 60, the user may perform a touch action (including a force touch action) by contacting the cover window 60 using a part of the body (or a touch pen). In addition, the cover window 60 has fluidity to transmit the force touch (touch pressure) to a pressure sensor (e.g., touch sensor or force touch sensor) 300 to be described below. For example, the cover window 60 may include a flexible material that may be bent, for example, tempered glass, reinforced plastic, and a polymer material. According to various embodiments, the cover window 60 may also be referred to as a glass window. Since the pressure sensor 300 senses a pressure according to the force touch, it is referred to as a pressure sensor 300.

The display panel 100, a first printed circuit board (PCB) 200, and the pressure sensor 300 are disposed below the cover window 60, and in some examples, between the cover window 60 and the bracket 40. In addition, the display panel 100 may be electrically connected to the main circuit board 30 through the first PCB 200 to output contents (e.g., text, images, videos, icons, widgets, or symbols). In addition, the pressure sensor 300 may be electrically connected to the main circuit board 30 through the first PCB 200, may receive a touch pressure (force touch) from the user, and may output the touch pressure to the main circuit board 30.

The pressure sensor 300 includes a first conductor, a second conductor forming a capacitance with the first conductor, and an elastic element disposed between the first conductor and the second conductor. The first conductor may be a sensing electrode 330 disposed on or in the first PCB 200. The second conductor may be a conductive sheet 310 attached to a back surface of the display panel 100. Hereinafter, the first conductor is referred to as the sensing electrode 330, and the second conductor is referred to as the conductive sheet 310. The first PCB 200 includes wiring pads 210 and 220, and may be connected to the display panel 100 through the wiring pads 210 and 220. The display panel 100, the first PCB 200, and the pressure sensor 300 will be described below with reference to FIGS. 3, 4A, and 4B.

According to an embodiment of the present invention, the display panel 100 may include a liquid crystal display (LCD) panel, a light emitting diode (LED) display panel, an organic light emitting diode (OLED) display panel, a microelectromechanical systems (MEMS) display panel, an electronic paper display panel, or the like. The display panel 100 may have flexibility.

The first PCB 200 may include a wiring structure configured such that the main circuit board 30 may be electrically connected to the pressure sensor 300 and the display panel 100. The first PCB 200 may be implemented as a flexible printed circuit board (FPCB) or a rigid PCB. In addition, a sensor controller 380 for controlling the pressure sensor 300 may be formed as an integrated circuit (IC) chip to be mounted on the first PCB 200 or the main circuit board 30.

The bracket 40 supports the display panel 100, the first PCB 200, and the pressure sensor 300. Accordingly, an elastic element (also referred to an elastic member) 320 of the pressure sensor 300 may be contracted according to a touch pressure applied to the cover window 60. The bracket 40 may include, for example, a magnesium alloy, and may be disposed on the main circuit board 30. According to an embodiment, a through hole may be defined at the bracket 40, through which a part of the first PCB 200 may pass through. In addition, according to an embodiment, a swelling gap may be defined at the bracket 40 in consideration of swelling of the battery due to aging. According to various embodiments, the through hole may be referred to in various terms such as a via hole, an opening, and an opening part.

The main circuit board 30 may be disposed below the bracket 40, and may be electrically connected to the first PCB 200 and the display panel 100 through a designated connector or a designated wiring. The main circuit board 30 may be implemented as, for example, a rigid PCB. According to an embodiment, various electronic components, elements, printed circuits, and the like of the display device 10 may be mounted or arranged on the main circuit board 30. The main circuit board 30 may be referred to as a main board, a printed board assembly (PBA), or simply, a PCB.

A processor, a communication module, various interfaces, a power management module, and the like may be mounted on the main circuit board 30 in the form of an IC chip. In addition, the sensor controller 380 for controlling the pressure sensor 300 may be formed as an IC chip to be mounted at the main circuit board 30. For example, the sensor controller may be part of the processor described above.

The housing 20 may be disposed below the main circuit board 30 to support the bracket 40 and accommodate each component of the display device 10. The housing 20 may also be referred to as a rear case, a rear plate, or the like. The housing 20 may include an area that is not exposed to the outside of the display device 10, and an area that is exposed to an outer side surface of the display device 10. For example, the area that is not exposed to the outside of the display device 10 may include a plastic injection material, and the area exposed to the outer side surface of the display device 10 may include metal. The area exposed to the outer side surface of the display device 10, including a metal material, may also be referred to as a metal bezel. According to an embodiment, at least a part of the metal bezel may be utilized as an antenna radiator for transmitting and receiving a signal of a designated frequency.

According to various embodiments of the present invention, at least one of the above-described components may be omitted from the display device 10, or the display device 10 may further include at least one other component. According to an embodiment of the present invention, the display device 10 may further include a touch sensing layer. The touch sensing layer may be stacked between the cover window 60 and the display panel 100, and may include a touch sensor capable of sensing contact or approach of a touch object, for example, the user's body part or an electronic pen. In addition, the touch sensing layer may be included in the display panel 100. In addition, the display device 10 may further include a battery capable of supplying power to the display device 10.

Hereinafter, the display panel 100, the first PCB 200, and the pressure sensor 300 will be described in detail with reference to FIGS. 3, 4, and 5.

Figure 3:
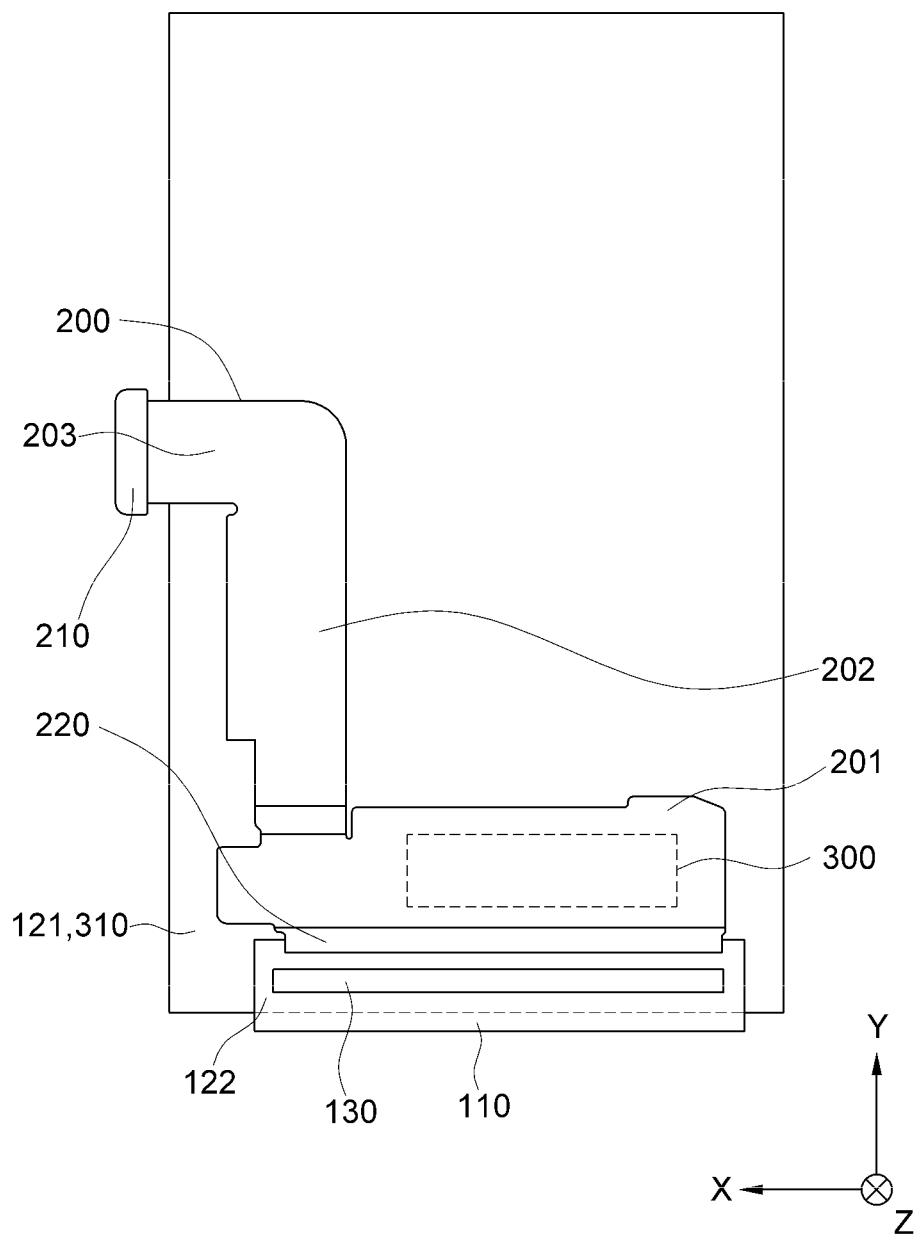
FIG. 3 is a plan view illustrating a back surface of a display panel according to an embodiment of the present invention.
Figure 4A:
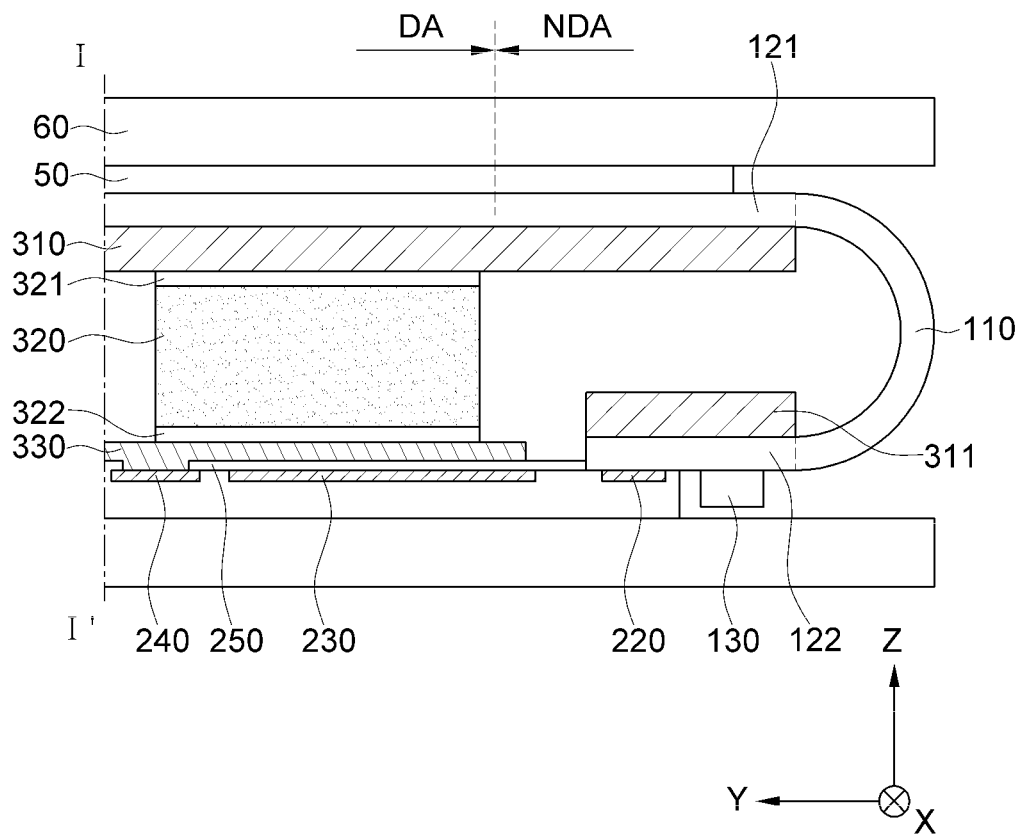
FIG. 4A is a cross-sectional view taken along the line I-I' of FIG. 2.
Figure 4B:
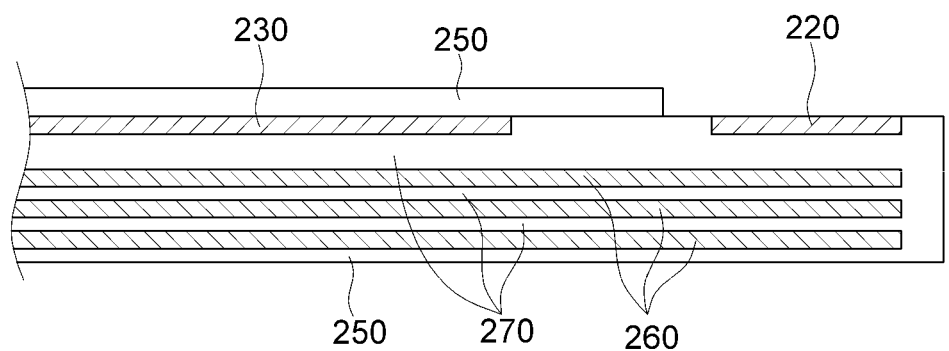
FIG. 4B is a view enlarging a first printed circuit board according to an embodiment of the present invention.

FIG. 3 is a plan view illustrating a back surface of the display panel 100 according to an embodiment. FIG. 4A is a cross-sectional view taken along the line I-I' of FIG. 2. FIG. 4B is a view enlarging the first PCB 200 according to an embodiment. FIG. 5 is a block diagram illustrating the pressure sensor 300 according to an embodiment.

The display panel 100 is disposed below the cover window 60 and may display various contents. The display panel 100 may include a substrate, a plurality of pixels PX disposed on one surface of the substrate, and at least one conductive line electrically connected to the pixels PX. The substrate may include a flexible material so that at least a portion (e.g., a bending portion 110) of the substrate may be bent in a direction toward a back surface of the substrate. The conductive line may include at least one gate line or at least one data line. According to an embodiment, the plurality of gate lines and the plurality of data lines may be arranged in a matrix, and the plurality of pixels PX may be arranged adjacent to points where the lines intersect each other, and may be electrically connected to the lines.

Referring to FIG. 4A, the display panel includes a display area DA and a non-display area NDA around the display area DA.

The display area DA is an area for displaying a screen. A planar shape of the display area DA may be a quadrangle or a quadrangle with rounded corners. The planar shape of the display area DA is not limited to a quadrangle, and the display area DA may have a circular shape, an elliptical shape, or various other shapes. The display area DA includes an active area including a plurality of pixels.

The non-display area NDA is disposed around the display area DA. The non-display area NDA may form an edge of the display device 10.

A driver for driving a pixel circuit of the display area DA may be disposed at the non-display area NDA. The driver may include a driving circuit 130 and a driving wiring for transmitting driving signals.

According to various embodiments of the present invention, the driving circuit 130 may include a driver IC that provides driving signals and image signals to the display panel 100, or a timing controller (T-con) for controlling the driving signals and the image signals. The driver IC may include a gate driver IC for sequentially selecting gate signal lines of the display panel 100 and applying scan signals (or driving signals) to the selected gate signal lines, and a data driver IC (or a source driver IC) for applying image signals to a data signal line of the display panel 100. According to an embodiment, when the gate driver IC selects the gate signal line and applies a scan signal thereto to change a state of a corresponding pixel PX to an active state, the data driver IC may apply an image signal to the corresponding pixel PX through the data signal line. The timing controller may adjust transmission times of the signals transmitted to the driver IC, and substantially prevent a display time difference that may occur during a process of outputting the signals to the display panel 100.

The display device 10 may include a polarization film 50 disposed on a display surface of the display panel 100. The polarization film 50 may be attached on the display surface of the display panel 100 using an adhesive layer. The polarization film 50 may cover an entire portion of the display area DA. In addition, the polarization film 50 may extend outwardly from an outer edge of the display area DA to cover at least a part of the non-display area NDA.

According to an embodiment of the present invention, the display panel 100 may include flat portions 121 and 122 and a bending portion 110. The flat portions 121 and 122 may include an upper flat portion 121 and a lower flat portion 122 which overlap each other in a thickness direction (Z-axis direction), and the bending portion 110 may be disposed between the two flat portions 121 and 122. The bending portion 110 may be bent in a direction opposite to a display direction (in the case of a top emission type, in a direction toward a lower surface) with respect to the upper flat portion 121. The bending portion 110 may be disposed on at least one side of the upper flat portion 121. Although the bending portion 110 is depicted in the drawing as being disposed adjacent to a lower edge of the upper flat portion 121, embodiments are not limited thereto. In an embodiment, the bending portion 110 may be disposed on two or more edges of the upper flat portion 121, for example, on the lower edge and an upper edge of the upper flat portion 121. In an embodiment, a position of the bending portion 110 may be adjacent to other edges such as a left edge, a right edge, and an upper edge, other than the lower edge of the upper flat portion 121.

The display area DA and a part of the non-display area NDA may be disposed at the upper flat portion 121. Another part of the non-display area NDA may be disposed at the bending portion 110 and the lower flat portion 122. As such, if at least a part of the non-display area NDA is bent in the direction opposite to the display direction, the bezel of the display device 10 may be reduced.

A driving signal wiring for transmitting a driving signal from the driving circuit 130 may be disposed at the non-display area NDA adjacent to a lower edge of the display area DA. As illustrated in FIGS. 3 and 4A, the driving circuit 130 may be directly mounted at the non-display area NDA of the bending portion 110 and the lower flat portion 122, and may be connected to the driving signal wiring. In some examples, the first PCB 200 to which the driving circuit 130 is mounted may be attached to the lower flat portion 121 or the bending portion 110 so that the driving circuit 130 and the driving signal wiring at the non-display area NDA may be electrically connected to each other.

The driving circuit 130 or the first PCB 200 may be electrically connected to a pad of the non-display area NDA, where the driving signal wiring is exposed, using an anisotropic conductive film or the like.

A bending protection layer may be disposed at the bending portion 110. The bending protection layer may cover the bending portion 110 to protect the substrate and the driving signal wiring that is bent and to further alleviate a bending stress. The bending protection layer may be partly removed from an area of the lower flat portion 122 where the driving circuit 130 and the first PCB 200 are mounted, thereby exposing a driving signal wiring pad.

Referring to FIG. 3, the first PCB 200 includes the wiring pad 220 connected to the lower flat portion 122 of the display panel 100, and the wiring pad 210 connected to the main circuit board 30. As used herein, the wiring pad 210 may include a driving wiring pad. The first PCB 200 may include a horizontal portion 201 extending in a direction (X-axis direction) parallel to an edge of the lower flat portion 122, a vertical portion 202 extending in a direction (Y-axis direction) perpendicular to the horizontal portion 201, and a connection portion 203 extending again in a direction (X-axis direction) perpendicular to the vertical portion 202. The wiring pad 220 connected to the display panel 100 is disposed at one end portion of the horizontal portion 201, and the wiring pad 210 connected to the main circuit board 30 is disposed at one end portion of the connection portion 203. Another end portion of the horizontal portion 201 and another end portion of the connection portion 203 are connected to the vertical portion 202. Wirings that are connected to the wiring pad 220 connected to the display panel 100, and/or wirings that are connected to the wiring pad 210 connected to the main circuit board 30 are disposed at the horizontal portion 201, the vertical portion 202, and the connection portion 203. As illustrated in FIG. 4B, these wirings may have a multilayer structure.

Referring to FIGS. 3 and 4A, the pressure sensor 300, and more particularly, the sensing electrode 330, may be disposed on (or in the embodiments of FIG. 12, disposed in) the horizontal portion 201 of the first PCB 200, and may overlap the display area DA of the display panel 100 in a plan view. However, embodiments are not limited thereto, and the sensing electrode 330 may be disposed on or in the vertical portion 202 of the first PCB 200, and may overlap the non-display area NDA of the display panel 100 in a plan view.

Referring to FIG. 4B, the first PCB 200 includes a plurality of wiring layers 260, an insulating layer 270 between each of the wiring layers 260, and a cover layer 250 covering an outer portion of the first PCB 200.

Referring to FIGS. 3, 4A and 4B, a wiring layer (hereinafter, "an outermost wiring layer") most adjacent to the display panel 100 includes the wiring pads 210 and 220, a shielding layer 230, sensing electrode pads 240, and sensing electrode connection wirings (see 243 and 244 of FIGS. 6 and 8). Herein, the sensing electrode pad 240 may include a first sensing electrode pad (see 241 of FIGS. 6 and 8) and a second sensing electrode pad (see 242 of FIGS. 6 and 8). The wiring pads 210 and 220 and the sensing electrode pads 240 are not covered by the cover layer 250 and are exposed. The shielding layer 230 and the sensing electrode connection wirings may be covered and insulated by the cover layer 250.

The wiring pads 210 and 220, the shielding layer 230, the sensing electrode pads 240, and the sensing electrode connection wirings may be formed by various methods such as a patterning process.

The outermost wiring layer (i.e., the wiring pads 210 and 220, the shielding layer 230, the sensing electrode pads 240, and the sensing electrode connection wirings), and the wiring layers 260 therebelow may be insulated by the insulating layer 270 disposed therebetween.

The insulating layer 270 includes various insulating materials such as polyimide, polyester, glass epoxy, and prepreg. In such an embodiment, the insulating layer 270 may be formed in a square, a quadrangle, and various shapes depending on the application to which the insulating layer 270 is applied.

The first PCB 200 may include a plurality of wiring layers 260 separated from each other by the insulating layer 270. The outermost wiring layers 210, 220, 230, and 240 or the wiring layer 260 (hereinafter, "a lower wiring layer") below the outermost wiring layers 210, 220, 230, and 240 may be formed through a patterning process. A wiring disposed at the lower wiring layer 260 may be connected to a wiring disposed at another lower wiring layer 260 or the wiring pads 210 and 220 of the outermost wiring layer through a contact hole defined at the insulating layer 270.

Signals for driving the pressure sensor 300 and signals output from the pressure sensor 300 may be applied to the wirings of the outermost wiring layers 210, 220, 230, and 240. The lower wiring layer 260 may connect the display panel 100 and the main circuit board 30, and may transmit, for example, signals for driving the display panel 100, data signals for images to be displayed on the display panel 100, driving signals and output signals for a touch sensing layer included in the display panel 100 or a touch sensing layer disposed on the display panel 100, and a power.

In an embodiment of the present invention, in the patterning process, a photosensitive layer, for example, a photosensitive dry film, is firstly applied on a copper foil layer. Next, the photosensitive dry film is exposed using an exposure apparatus, the exposed copper foil layer is developed with a developer, and then a predetermined pattern is formed through etching, such that patterns for the outermost wiring layers 210, 220, 230, and 240, and the lower wiring layer 260 are formed.

The cover layer 250, for example, a cover film 250 is formed on the outermost wiring layers 210, 220, 230, and 240. In such an embodiment, the cover layer 250 is formed over an entire surface of the outermost wiring layers 210, 220, 230, and 240, and serves to protect and insulate a circuit pattern 21 from the outside. However, the cover layer 250 is not disposed on at least a portion of the wiring pads 210 and 220 and the sensing electrode pads 240 of the outermost wiring layers, and they are exposed.

In an embodiment of the present invention, the cover layer 250 has an opening part for exposing at least a portion of the wiring pads 210 and 220 and the sensing electrode pads 240 of the outermost wiring layers. The cover layer 250 may be formed at a part of a peripheral area of the wiring pads 210 and 220 and the sensing electrode pads 240, and may overlap a part of the wiring pads 210 and 220 and the sensing electrode pads 240.

The cover layer 250 may also be formed on a back surface of the first PCB 200, that is, over an entire surface of the outermost wiring layers 210, 220, 230, and 240 on the side opposite from the front surface of the outermost wiring layers 210, 220, 230, and 240.

As such, the cover layer 250 disposed over the entire surface of the first PCB 200 may expose at least a portion of the wiring pads 210 and 220 and the sensing electrode pads 240. Accordingly, the first PCB 200 may be electrically connected to the main circuit board 30 or the display panel 100 through the wiring pads 210 and 220, and may be electrically connected to the pressure sensor 300, and in some examples, to the sensing electrode 330, through the sensing electrode pads 240.

Referring again to FIG. 4A, the pressure sensor 300 is disposed between the display panel 100 and the first PCB 200.

In some examples, the conductive sheet 310 is attached below the upper flat portion 121 using an adhesive layer. The conductive sheet 310 may be attached over an entire surface of the display area DA or the upper flat portion 121. The conductive sheet 310 may extend from the upper flat portion 121 to a boundary between the upper flat portion 121 and the bending portion 110. The conductive sheet 310 may be grounded (e.g., electrically grounded) as described below.

Referring to FIG. 4A, the conductive sheet 311 may also be attached below the lower flat portion 122 of the display panel 100, using an adhesive layer. The conductive sheet 311 below the lower flat portion 122 may extend from the lower flat portion 122 to a boundary between the lower flat portion 122 and the bending portion 110.

The conductive sheets 310 and 311 may support the flat portions 121 and 122 of the display panel 100, and may serve for the bending portion 110 to maintain a gentle curve having a constant curvature.

In addition, the conductive sheets 310 and 311 may serve as a heat radiation sheet or may include a heat radiation sheet. For example, the conductive sheets 310 and 311 may include a graphite sheet including graphite and/or a copper sheet including copper. In some examples, the conductive sheets 310 and 311 may have a multilayer structure in which a graphite sheet and/or a copper sheet are laminated. However, embodiments are not limited thereto, and the conductive sheet may include metals having high conductivity and high thermal conductivity, such as nickel, gold, silver, and/or the like. For example, the conductive sheet 310 has a thermal conductivity in an X-Y direction in a range from about 100 W/mK to about 400 W/mK, and has a thermal conductivity in a Z-axis direction in a range from about 1 W/mK to about 30 W/m K.

In an embodiment of the present invention, the conductive sheet 310 may be a single-layer or multilayer composite sheet that has conductivity, supports the display panel 100, and serves as a heat radiation sheet for dissipate the heat emitted by the display panel 100.

Figure 12:
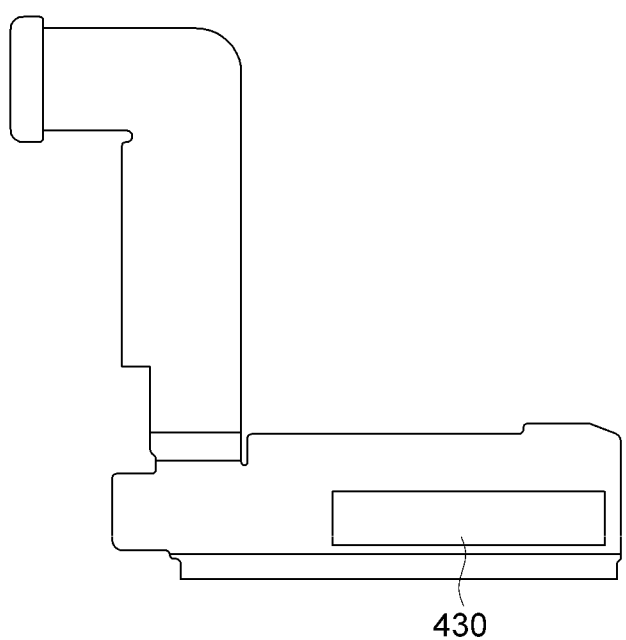
FIG. 12 is a plan view illustrating a lower wiring layer of a printed circuit board according to an embodiment of the present invention.

The sensing electrode 330 is attached to an upper surface of the first PCB 200, and in some examples, to the cover layer 250, and is attached and electrically connected to the sensing electrode pad 240 through an opening part defined at the cover layer 250. However, embodiments are not limited thereto, and as illustrated in FIG. 12, the sensing electrodes 440 and 450 may be disposed in the first PCB 200 and may be covered by the cover layer 250. At least a portion or an entirety of the sensing electrode 330 may overlap the conductive sheet 310 in a plan view. The sensing electrode 330 may include at least two sensing electrodes (also referred to as first conductors) 340 and 350 that are separated from each other.

The sensing electrode 330 may include a conductive material. The conductive material of the sensing electrode 330 may include a metal or an alloy thereof. The metal may include, for example, gold (Au), silver (Ag), aluminum (Al), molybdenum (Mo), chromium (Cr), titanium (Ti), nickel (Ni), neodymium (Nd), copper (Cu), and platinum (Pt). In an embodiment, the sensing electrode 330 may include a transparent conductive material. Examples of the transparent conductive material may include silver nano wire (AgNW), indium tin oxide (ITO), indium zinc oxide (IZO), antimony zinc oxide (AZO), indium tin zinc oxide (ITZO), zinc oxide (ZnO), tin oxide ($SnO_2$), carbon nano tube, and graphene. The sensing electrode 330 may have a single layer or a multilayer structure.

The elastic element 320 is disposed between the first conductors 340 and 350 and the second conductor (i.e., the conductive sheet) 310. That is, the elastic element 320 is disposed between the conductive sheet 310 and the sensing electrode 330. For example, one surface of the elastic element 320 may contact the conductive sheet 310, and another surface of the elastic element 320 may contact the sensing electrode 330. In addition, adhesive layers 321 and 322 may be disposed between the elastic element 320 and the sensing electrode 330 and between the elastic element 320 and the conductive sheet 310, respectively. The elastic element 320 may overlap the conductive sheet 310 and the sensing electrode 330 in a plan view. The elastic element 320 may have a shape corresponding to a shape of the sensing electrode 330 in a plan view.

However, embodiments of the present invention are not limited thereto, and the elastic member 320 may not overlap the conductive sheet 310 or the sensing electrode 330 in a plan view. For example, the elastic element 320 may be disposed on the outside of the sensing electrode 330, between the conductive sheet 310 and the first PCB 200, in a plan view. In addition, the elastic element 320 may not overlap the first PCB 200 in a plan view. The elastic element 320 may be disposed at any position where a distance between the conductive sheet 310 and the sensing electrode 330 may vary according to a pressure applied to the cover window 60. For example, the elastic element 320 may be the cover window 60, and an air or any dielectric element may be located between the conductive sheet 310 and the sensing electrode 330.

The elastic element 320 may serve to mitigate external impact, and may have an elastic force to perform such a role. For example, the elastic element 320 may be deformed by a pressure applied from the outside, and may have an elastic force that allows the elastic element 320 to be restored to the original state when the pressure from the outside is removed.

In addition, the elastic element 320 may have an insulating property to substantially prevent an electric short between the conductive sheet 310 and the sensing electrode 330. The elastic element 320 may be provided as a porous polymer so as to have an elastic force. For example, the elastic member 320 may be provided in the form of foam, such as a sponge.

For example, the elastic element 320 may include, for example, thermoplastic elastomers, polystyrene, polyolefin, polyurethane thermoplastic elastomers, polyamide, synthetic rubbers, polydimethylsiloxane, polybutadiene, polyisobutylene, poly(styrenebutadienestyrene), polyurethane, polychloroprene, polyethylene, and silicone, and combinations thereof; however, embodiments of the present invention are not limited thereto.

Figure 5:
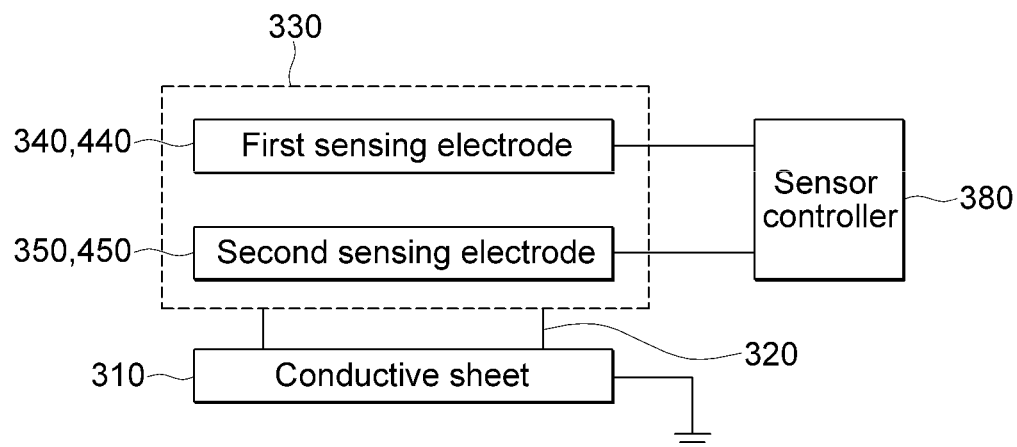
FIG. 5 is a block diagram illustrating a pressure sensor according to an embodiment of the present invention.

FIG. 5 is a block diagram illustrating a function of the pressure sensor 300 according to an embodiment.

As described above, the pressure sensor 300 may be electrically connected to the first PCB 200 and may be disposed between the display panel 100 and the first PCB 200. The pressure sensor 300 includes the first conductor, for examples, the conductive sheet 310; the second conductor, for example, the sensing electrode 330; the elastic element 320 between the conductive sheet 310 and the sensing electrode 330; and the sensor controller 380 electrically connected to the sensing electrode 330.

As described above, the sensing electrode 330 may include at least two sensing electrodes 340 and 350 that are separated from each other, and the sensor controller 380 may be electrically connected to each of the sensing electrodes 340 and 350.

The conductive sheet 310 and the sensing electrode 330 may serve as a capacitor, and a capacitance may be formed between the conductive sheet 310 and the sensing electrode 330. The sensor controller 380 may sense a magnitude of the pressure applied to the cover window 60 based on a change in capacitance between the conductive sheet 310 and the sensing electrode 330. For example, a distance between the conductive sheet 310 and the sensing electrode 330 may be changed by the pressure applied to the cover window 60. Since the capacitance between the conductive sheet 310 and the sensing electrode 330 changes according to the distance between the conductive sheet 310 and the sensing electrode 330, the magnitude of the pressure applied to the cover window 60 may be detected based on the change in capacitance between the conductive sheet 310 and the sensing electrode 330.

For example, when a pressure is not applied to the pressure sensor 300 or the cover window 60, a first capacitance may be formed between the conductive sheet 310 and the sensing electrode 330. When a pressure is applied to the cover window 60 based on a touch of the user or the like, a thickness of the elastic element 320 is changed, and thus the distance between the conductive sheet 310 and the sensing electrode 330 is changed. Accordingly, the capacitance between the conductive sheet 310 and the sensing electrode 330 may change. For example, the first capacitance may be changed to a second capacitance by the applied pressure.

Accordingly, as the external pressure increases, the capacitance between the conductive sheet 310 and the sensing electrode 330 may also increase. Accordingly, the magnitude of the pressure or the like may be detected by using an amount of change in capacitance generated in the pressure sensor 300.

The pressure applied to the pressure sensor 300 may be generated by the user's touch. However, embodiments are not limited thereto, and the pressure may be caused by various other causes.

The sensor controller 380 may sense the pressure applied to the pressure sensor 300 or the cover window 60 by sensing an amount of change in capacitance C between the conductive sheet 310 and the sensing electrode 330.

To this end, the sensor controller 380 may be connected to the sensing electrode 330, and the conductive sheet 310 may be grounded (e.g., electrically grounded). For example, the sensor controller 380 may sense the amount of change in capacitance C by using an output signal of the sensing electrode 330.

There may be various methods for sensing the amount of change in capacitance C. In addition, the sensor controller 380 may be connected to the conductive sheet 310 and the sensing electrode 330 together to detect the amount of change in capacitance C.

As described above, according to an embodiment of the present invention, the sensing electrode 330 includes the first sensing electrodes 340 and 440 and the second sensing electrodes 350 and 450 that are separated from each other. However, embodiments are not limited thereto, and the sensing electrode may include three or more sensing electrodes 330 separated from each other, and the plurality of separated sensing electrodes 330 may be arranged along the horizontal portion 201 of the first PCB 200.

Each of the separated sensing electrodes 340, 350, 440, and 450 may have each corresponding pressure sensing area. The pressure sensing area may be defined as an area to which a touch pressure may be input by the user, and may include not only an area that overlaps the sensing electrodes 340, 350, 440, and 450, but also an area therearound. For example, referring to FIGS. 7 and 11, respective pressure sensing areas may include areas each overlapping the sensing electrodes 340, 350, 440, and 450, and may further include peripheral display areas DA that do not overlap the sensing electrodes 340, 350, 440, and 450.

Hereinbelow, a force sensor according to an embodiment will be described in detail with reference to FIGS. 6 to 9.

Figure 6:
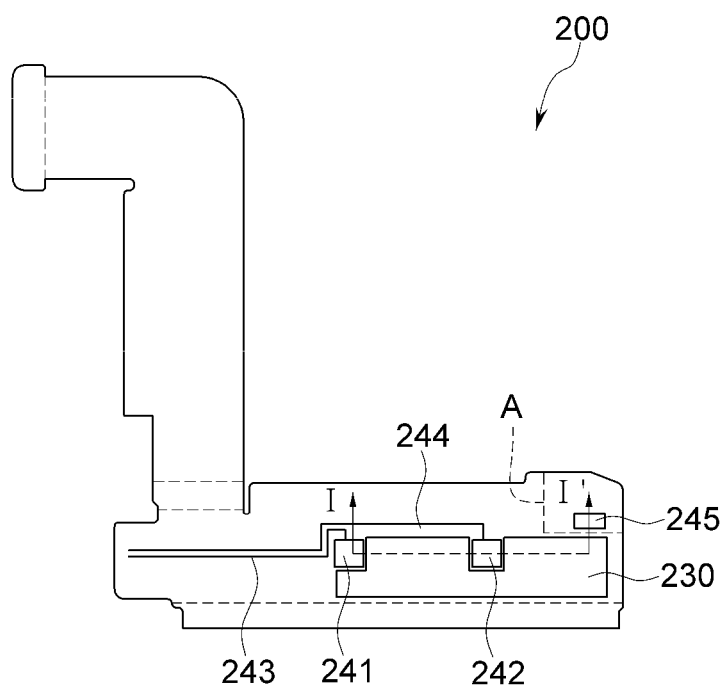
FIG. 6 is a plan view illustrating an outermost wiring layer of a first printed circuit board according to an embodiment of the present invention.
Figure 7:
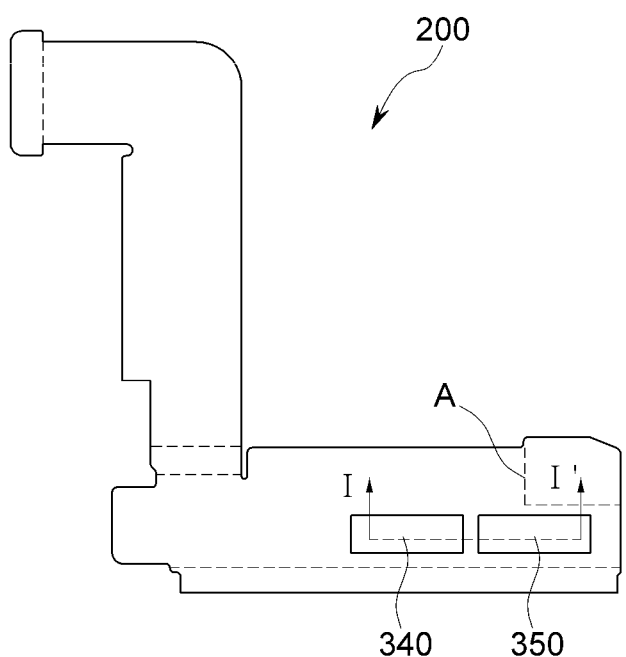
FIG. 7 is a plan view illustrating a sensing electrode disposed on a first printed circuit board according to an embodiment of the present invention.

FIG. 6 is a plan view illustrating an outermost wiring layer of a printed circuit board according to an embodiment. FIG. 7 is a plan view illustrating a sensing electrode disposed on a printed circuit board according to an embodiment. FIGS. 8 and 9 are cross-sectional views taken along the line I-I' of FIG. 6 according to embodiments.

The description of the display panel 100, the conductive sheet 310, the elastic element 320 and the adhesive layers 321 and 322 have been described hereinabove; thus, a description thereof may not be repeated here, and the sensing electrode 330 and the first PCB 200 will be mainly described hereinbelow.

As described above, FIG. 6 shows the outermost wiring layer of the first PCB 200, for example, a wiring layer immediately below the cover layer 250 of the first PCB 200 opposing the display panel 100. FIG. 7 shows the sensing electrodes 340 and 350 disposed on an upper surface of the first PCB 200 facing toward the display panel 100, and in some examples, on the cover layer 250 of the first PCB 200.

First, referring to FIG. 7, the first sensing electrode 340 and the second sensing electrode 350 are disposed apart from each other along the horizontal portion 201 of the first PCB 200. For example, the first sensing electrode 340 and the second sensing electrode 350 may be symmetric with respect to a center of the display area DA in the X-axis direction. In some examples, a third sensing electrode may be further provided, and the first sensing electrode 340 may be disposed at a center of the display area DA in the X-axis direction (a left and right direction in the drawing), and the second sensing electrode 350 and the third electrode may be symmetric with respect to the first sensing electrode 340.

Each of the sensing electrodes 340 and 350 overlaps the conductive sheet 310 in a plan view. Each of the sensing electrodes 340 and 350 may be electrically separated from each other, and may have different amounts of change in capacitance depending on a location of the touch pressure input through the cover window 60. Accordingly, the location of the touch may be estimated according to the capacitance of each of the sensing electrodes 340 and 350.

Referring to FIG. 7, each of the sensing electrodes 340 and 350 has a substantially same quadrangular shape. However, embodiments of the present invention are not limited thereto, and each of the sensing electrodes 340 and 350 may have any shape, for example, a circle, an ellipse, and a polygon.

Figure 8:
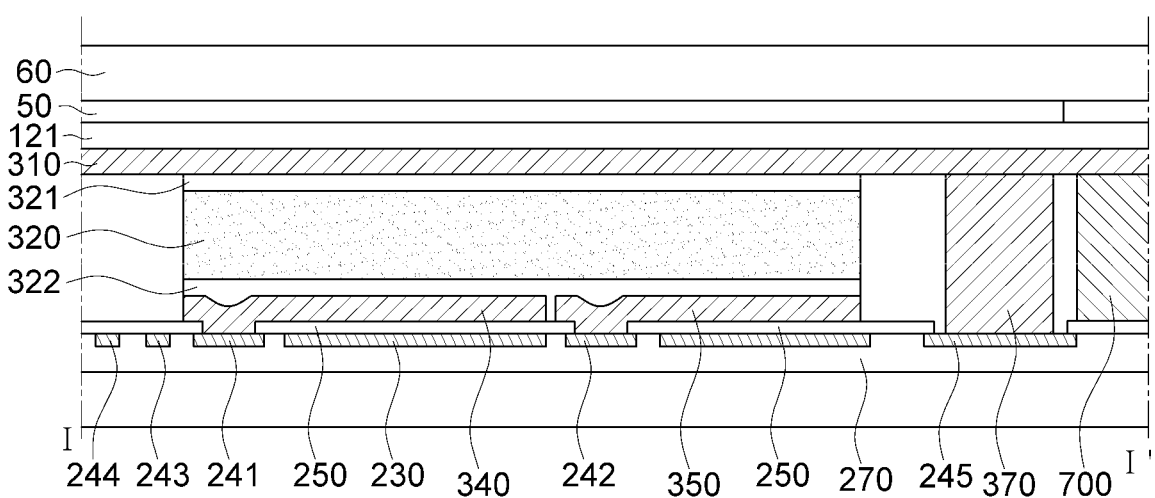
FIGS. 8-9 are cross-sectional views taken along the line I-I' of FIG. 6 according to an embodiment of the present invention.
Figure 9:
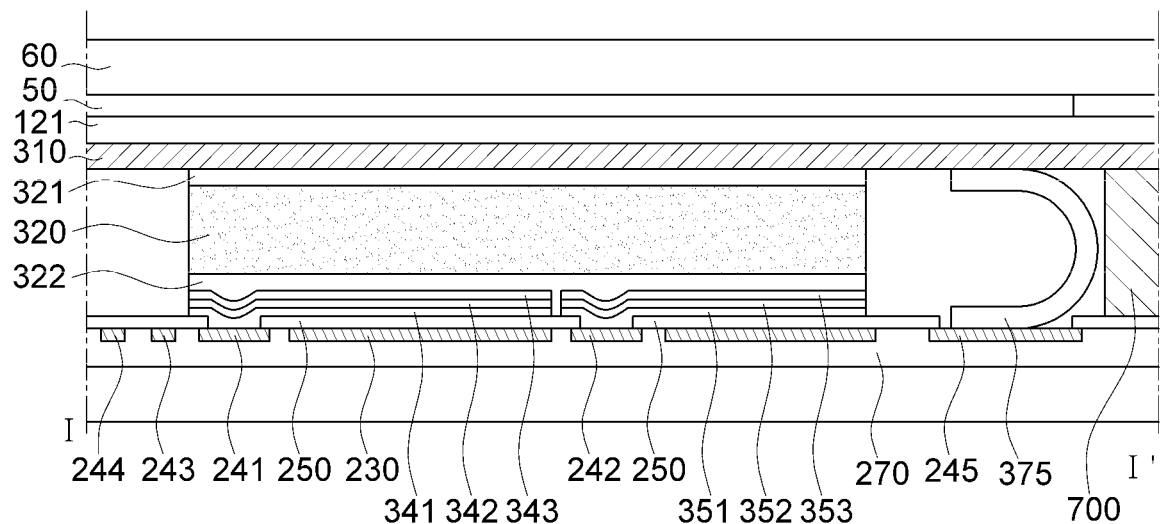

Referring to FIG. 8, each of the sensing electrodes 340 and 350, as the first conductor, may be attached to the elastic element 320 using the adhesive layer 322.

Each of the sensing electrodes 340 and 350 is disposed on an upper surface of the first PCB 200, for example, on the cover layer 250. The cover layer 250 covers the upper surface of the first PCB 200, and has an opening part that exposes at least a portion of the sensing electrode pads 240 and at least a portion of the ground electrode pad (i.e., the second pad) 245. The sensing electrodes 340 and 350 are electrically connected to the sensing electrode pads 240, respectively, through opening parts of the cover layer 250. In some examples, the first sensing electrode 340 contacts the first sensing electrode pad 241, and the second sensing electrode 350 contacts the second sensing electrode pad 242.

Referring to FIG. 6, the sensing electrode pads 241 and 242 are connected to the sensor controller 380 through the sensing electrode connection wirings 243 and 244, respectively. The sensing electrode connection wirings 243 and 244 may be connected to the wiring pads 210 and 220, respectively. For example, the sensing electrodes 340 and 350 may be electrically connected to the sensor controller 380 through the sensing electrode pads 241 and 242 and the sensing electrode connection wirings 243 and 244, respectively.

The shielding layer 230 that overlaps, in a plan view, at least a portion of the sensing electrodes 340 and 350, and preferably, the entirety of the sensing electrodes 340 and 350, may be disposed at the outermost wiring layer. The shielding layer 230 may be completely covered by the cover layer 250, and insulated from the sensing electrodes 340 and 350. In addition, the shielding layer 230 may be electrically insulated and separated from the sensing electrode pads 241 and 242 and the sensing electrode connection wirings 243 and 244. In addition, the shielding layer 230 may enclose the sensing electrode pads 241 and 242 and/or the sensing electrode connection wirings 243 and 244.

The shield layer 230 is disposed on a back surface of the cover layer 250, and may have a shape that entirely overlaps the sensing electrodes 340 and 350. The shielding layer 230 serves to shield electromagnetic waves and noise signals, generated from circuits disposed below the sensing electrodes 340 and 350, for example, the first PCB 200 and the main circuit board 30, from affecting the sensing electrodes 340 and 350, and to substantially prevent formation of a parasitic capacitance between the sensing electrodes 340 and 350 and other wiring layers 260 of the first PCB 200. The electric potential of the shielding layer 230 may always be maintained at a ground level. The shielding layer 230 may be connected to the ground electrode pad 245 as a second pad. The ground electrode pad 245 may always maintain its electric potential at the ground level.

As illustrated in FIG. 8, the sensing electrodes 340 and 350 are formed on the first PCB 200 at which the cover layer 250 defined with an opening part is disposed, and are attached to the elastic element 320 using the adhesive layer 322. Accordingly, the display panel 100, the pressure sensor 300, and the first PCB 200 may be attached to each other.

According to an embodiment of the present invention, the sensing electrodes 340 and 350 may be formed by applying or printing a conductive paste. The conductive paste is prepared by mixing a film-forming agent and a metal powder. Examples of the film-forming agent may include epoxies using cross-linking properties; liquids such as linseed oil, soybean oil, lacquer, tung oil, and synthetic drying oil; natural resins such as shellac and copal; processed resins such as limed rosin; synthetic resins such as phenol resins, urea resins, melamine resins, and vinyl resins; cellulose derivatives such as nitrocellulose and acetylcellulose; rubber derivatives such as synthetic rubber; polyvinyl alcohol; and solids, such as casein, that are dissolved in a solvent.

Examples of the metal powder of the conductive paste may include gold, silver, platinum, palladium, and copper having high electric conductivity.

Referring to FIGS. 5 to 9, the sensing electrodes 340 and 350 are first conductors disposed between the elastic element 320 and the first PCB 200. The conductive sheet 310 is a second conductor disposed between the elastic element 320 and the display panel 100 and forms a capacitance with the first conductors 340 and 350.

The first sensing electrode pad 241 and the second sensing electrode pad 242 are first pads connected to the first conductors 340 and 350, and the ground electrode pad 245 to which the ground voltage is applied is a second pad connected to the second conductor 310 through the first adhesive portions 370 and 375.

The first PCB 200 is disposed at one surface of the display panel 100 and includes the first pads 241 and 242 and the second pad 245.

The pressure sensor 300 is disposed between the display panel 100 and the first PCB 200 and includes the first conductors 340 and 350 connected to the first pads 241 and 242, and the second conductor 310 forming a capacitance with the first conductors 340 and 350. In addition, the pressure sensor 300 includes the elastic element 320 disposed between the display panel 100 and the first PCB 200.

The first conductors 340 and 350 are disposed between the elastic element 320 and the first PCB 200, and the second conductor 310 is disposed between the elastic element 320 and the display panel 100.

The first adhesive portions 370 and 375 include a conductive sponge 370 or a conductive tape 375 in contact with the second pad 245 and the second conductor 310. That is, the first adhesive portions 370 and 375 are conductive tapes, and the second adhesive portion 700 is a non-conductive tape.

The second adhesive portion 700 is spaced apart from the first adhesive portions 370 and 375 in a plan view to attach the second conductor 310 to the first PCB 200. The second adhesive portion 700 does not contact the second pad 245. In contrast, the first adhesive portions 370 and 375 contact the second pad 245.

The second adhesive portion 700 may have a thickness (height) substantially the same as or less than a thickness of each of the first adhesive portions 370 and 375. For example, the second adhesive portion 700 may have a thickness in a range from about 5 μm to about 15 μm.

The second adhesive portion 700 may have a thickness or an area greater than a thickness or an area of each of the first adhesive portions 370 and 375. Since the second adhesive portion 700 includes more adhesive material than the first adhesive portions 370 and 375, the second adhesive portion 700 may have an adhesive force greater than an adhesive force of each of the first adhesive portions 370 and 375. Accordingly, the adhesive force between the second adhesive portion 700 and the second conductor 310 is greater than the adhesive force between the first adhesive portions 370 and 375 and the second conductor 310.

The first adhesive portions 370 and 375 contact the second pad 245, and the second adhesive portions 700 contact the cover layer 250 of the first PCB 200.

Figure 10:
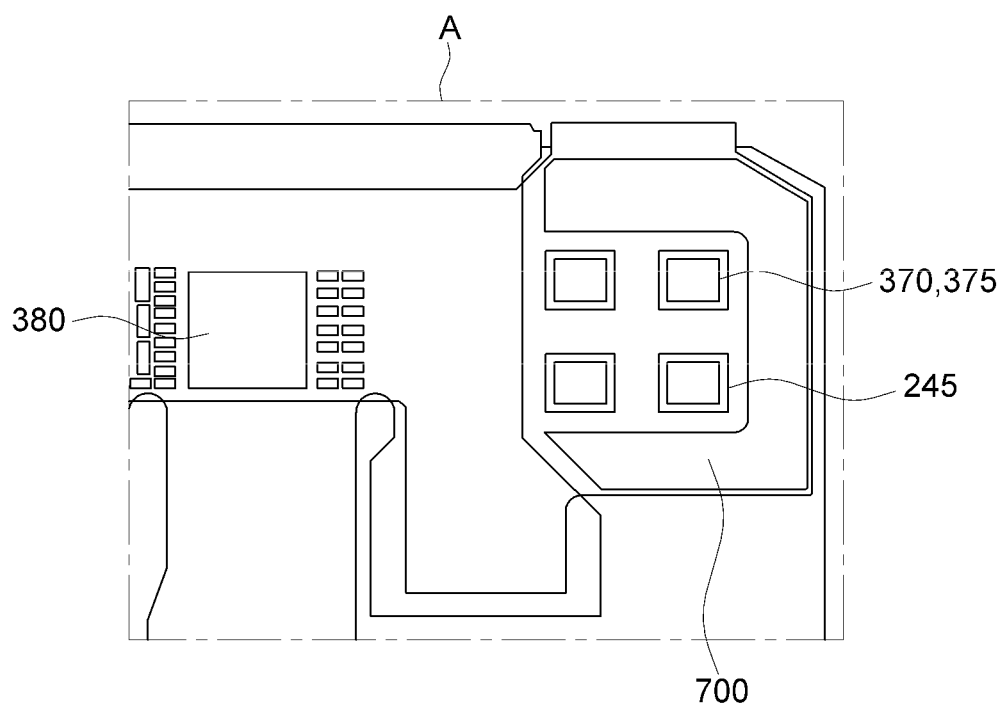
FIG. 10 is a view enlarging area A of FIGS. 6 and 7, illustrating a disposition between a first adhesive portion and a second adhesive portion according to an embodiment of the present invention.

As illustrated in FIG. 10, in a plan view, the second adhesive portion 700 may be spaced apart from the first adhesive portions 370 and 375, and may have a shape partially enclosing the first adhesive portions 370 and 375. FIG. 10 is a view enlarging area A of FIGS. 6 and 7, illustrating a disposition between the first adhesive portions 370 and 375 and the second adhesive portion 700 according to an embodiment. In such an embodiment, the second adhesive portion 700 may have one of a bracket shape (e.g., '[' shape), a 'C' shape (e.g., a '⊂' shape, a '⊃' shape, a '∪' shape, and all '∩' shape), a quadrangle shape, a grid shape (e.g., a '⊞' shape), a cross shape (e.g., '+' shape), for example, on a plane. The second adhesive portion 700 may have an adhesive force in a range from about 1.0 kgf/in to about 3.0 kgf/in.

As illustrated in FIG. 9, according to another embodiment, each of the sensing electrodes 340 and 350 may be formed as a conductive tape. The conductive tape includes adhesive layers 341 and 351, conductive layers 342 and 352, and insulating layers 343 and 353. In some examples, the insulating layers 343 and 353 may be omitted. The adhesive layers 341 and 351 have conductivity, and may physically/electrically connect the conductive layers 342 and 352 of the sensing electrodes 340 and 350 to the sensing electrode pads 241 and 242, respectively.

Each of the conductive layers 342 and 352 and the adhesive layers 341 and 351 of the conductive tape may include a conductive fiber and an adhesive. A conductive fiber, aluminum, copper, nickel foil, or the like may be used as a base of the conductive layer, and the adhesive may be provided on one surface of the conductive layer.

The conductive layer may be formed including various suitable material and/or compositions such as nickel (Ni), copper (Cu), a mixture of copper and nickel (e.g., Cu+Ni), mixture of copper, nickel, and gold (e.g., Cu+Ni+Au), mixture of copper, nickel, and other metals (e.g., Cu+Ni+other metals), mixture of copper, nickel, and resin (e.g., Cu+Ni+Resin), and the like, using an electroless plating method.

Referring to FIGS. 8 and 9, the first adhesive portions 370 and 375 are disposed between the conductive sheet 310 and the ground electrode pad 245 to electrically connect the conductive sheet 310 and the ground electrode pad 245. The first adhesive portions 370 and 375 include the conductive sponge 370 illustrated in FIG. 8 and the conductive tape 375 illustrated in FIG. 9. However, embodiments of the present invention are not limited thereto, and the first adhesive portions 370 and 375 may include any conductive material that contracts or changes its shape in accordance with deformation of the elastic element 320.

Referring to FIG. 8, one end portion of the conductive sponge 370 is attached to the conductive sheet 310, and another end portion of the conductive sponge 370 is attached to the ground electrode pad 245 exposed through the opening part of the cover layer 250.

The conductive sponge 370 may have a column shape that has a cross-section of a polygon, for example, a circle, an ellipse, or a quadrangle, in a plan view. The conductive sponge 370 may have a structure in which copper, nickel, silver, gold, or the like is plated on a foam that has excellent restoring force. A conductive adhesive layer is disposed at one end portion and another end portion of the conductive sponge 370, and the one end portion and the another end portion of the conductive sponge 370 are attached to the conductive sheet 310 and the ground electrode pad 245, respectively. Accordingly, the conductive sponge 370 electrically connects the conductive sheet 310 and the ground electrode pad 245 to each other.

Referring to FIG. 9, one end portion of the conductive tape 375 is attached to the conductive sheet 310, and another end portion of the conductive tape 375 is attached to the ground electrode pad 245 exposed through the opening part of the cover layer 250. As described above with respect to the conductive tapes 341, 342, 343, 351, 352 and 353 constituting the sensing electrodes 340 and 350, the conductive tape 375 may include an adhesive layer, a conductive layer, and an insulating layer. In some examples, the insulating layer may be omitted. The adhesive layer has conductivity, and may be attached to each of the conductive sheet 310 and the ground electrode pad 245 to electrically connect the conductive sheet 310 and the ground electrode pad 245 to each other.

Hereinbelow, a pressure sensor according to an embodiment of the present invention will be described in detail with reference to FIGS. 11 to 13.

Figure 11:
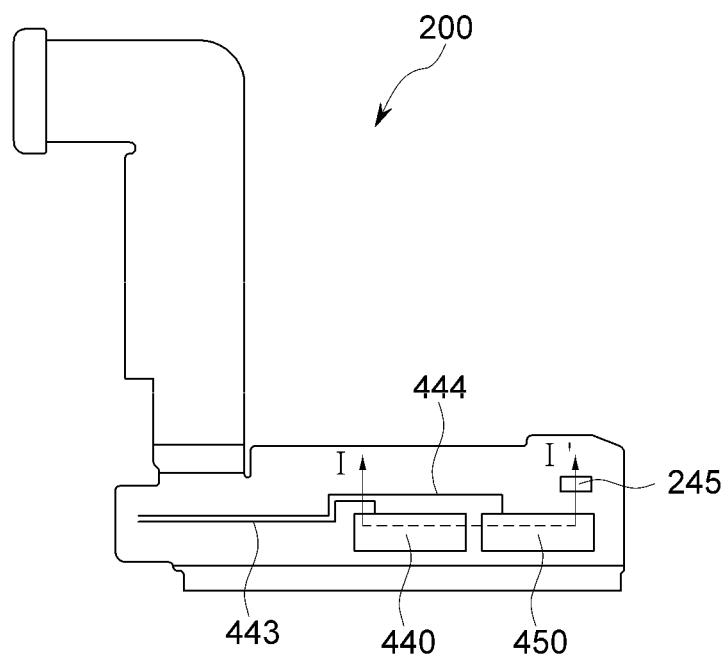
FIG. 11 is a plan view illustrating an outermost wiring layer of a printed circuit board according to an embodiment of the present invention.

FIG. 11 is a plan view illustrating an outermost wiring layer of a printed circuit board according to an embodiment of the present invention. FIG. 12 is a plan view illustrating a lower wiring layer of a printed circuit board according to an embodiment of the present invention. FIG. 13 is a cross-sectional view taken along the line I-I' of FIG. 11 according to an embodiment of the present invention.

Since the display panel 100, the conductive sheet 310, the elastic member 320, and the adhesive layers 321 and 322 have been described above, the description thereof will be omitted. Hereinafter, the sensing electrode 330 and the first PCB 200 will be mainly described.

As described above, FIG. 11 illustrates an outermost wiring layer, which is a wiring layer closest to the display panel 100 of the first PCB 200, and in some examples, the sensing electrodes 440 and 450 and the sensing electrode connection wirings 443 and 444 disposed immediately below the cover layer 250 of the first PCB 200.

FIG. 12 illustrates a shielding layer 430 disposed at a wiring layer (hereinafter, "a lower wiring layer") immediately below the outermost wiring layer of the first PCB 200. However, embodiments are not limited thereto, and another wiring layer may be interposed between the wiring layer on which the shielding layer 430 is disposed and the outermost wiring layer.

First, referring to FIG. 11, a first sensing electrode 440 and a second sensing electrode 450 are arranged apart from each other along the horizontal portion 201 of the first PCB 200. For example, the first sensing electrode 440 and the second sensing electrode 450 may be symmetric with respect to a center of the display area DA in the X-axis direction. In some examples, a third sensing electrode may be further provided, and the first sensing electrode 440 may be disposed at the center of the display area DA in the X-axis direction (a left and right direction in the drawing), and the second sensing electrode 450 and the third electrode may be symmetric with respect to the first sensing electrode 440.

Each of the sensing electrodes 440 and 450 overlaps the conductive sheet 310 in a plan view. Each of the sensing electrodes 440 and 450 may be electrically separated from each other, and may have different amounts of change in capacitance depending on a location of the touch pressure input through the cover window. Accordingly, the location of the touch may be estimated according to the capacitance of each of the sensing electrodes 440 and 450.

Referring to FIG. 11, each of the sensing electrodes 440 and 450 has substantially the same quadrangular shape. However, embodiments are not limited thereto, and each of the sensing electrodes 440 and 450 may have any shape, for example, a circle, an ellipse, and a polygon.

The sensing electrodes 440 and 450 are connected to the sensor controller 380 through the sensing electrode connection wirings 443 and 444, respectively, disposed at the same outermost wiring layer. The sensing electrode connection wirings 443 and 444 may be connected to the wiring pads 210 and 220, respectively. For example, the sensing electrodes 440 and 450 may be electrically connected to the sensor controller 380 through the sensing electrode connection wirings 443 and 444, respectively.

Figure 13:
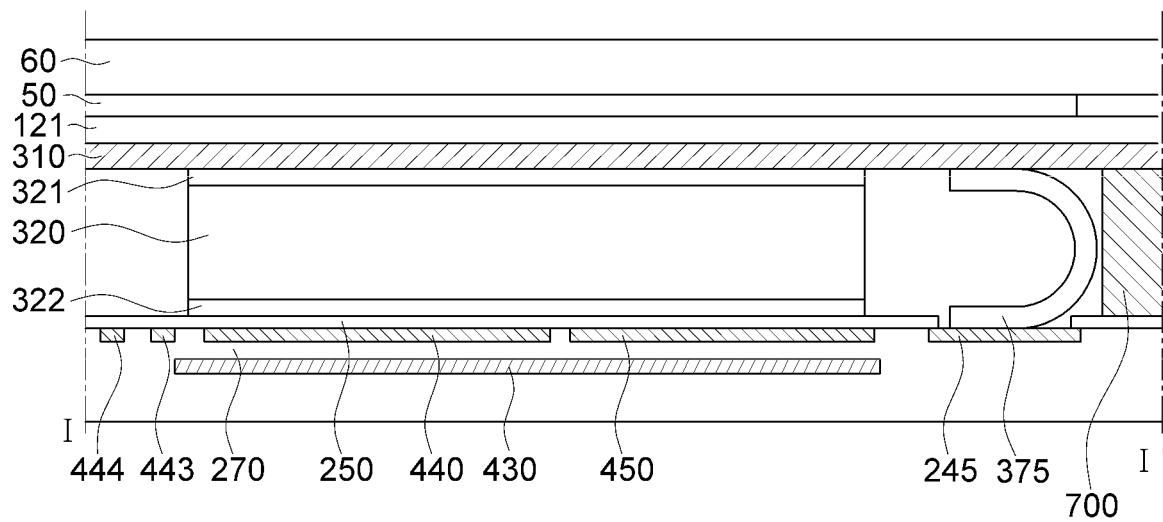
FIG. 13 is a cross-sectional view taken along the line I-I' of FIG. 11 according to an embodiment of the present invention.

Referring to FIG. 13, the insulating layer 270 may be disposed on back surfaces of the sensing electrodes 440 and 450 and the sensing electrode connecting wirings 443 and 444 to electrically insulate them from the shielding layer 430 and other wiring layers 260.

The cover layer 250 is disposed on upper surfaces of the sensing electrodes 440 and 450 and the sensing electrode connection wirings 443 and 444. The adhesive layer 322 is disposed between the cover layer 250 and the elastic element 320 so that the first PCB 200 and the elastic element 320 may be attached to each other.

The cover layer 250 has an opening part that exposes at least a portion of the ground electrode pad 245. Referring to FIG. 13, the first adhesive portions 370 and 375 are disposed between the conductive sheet 310 and the ground electrode pad 245 to electrically connect the conductive sheet 310 and the ground electrode pad 245 to each other. The first adhesive portions 370 and 375 include the conductive sponge 370 illustrated in FIG. 8 and the conductive tape 375 illustrated in FIG. 9. However, embodiments of the present invention are not limited thereto, and the first adhesive portions 370 and 375 may include any conductive material that contracts or changes its shape in accordance with deformation of the elastic element 320.

The shielding layer 430 that overlaps, in a plan view, at least a portion of the sensing electrodes 440 and 450 disposed at the outermost wiring layer, and preferably, the entirety of the sensing electrodes 440 and 450, may be disposed at the lower wiring layer. The shielding layer 430 may be disposed between the two insulating layers 270 and may be separated and electrically insulated from the sensing electrodes 440 and 450, the sensing electrode connection wirings 443 and 444, and the wiring layers 260 therebelow.

The shielding layer 430 serves to shield electromagnetic waves and noise signals, generated from circuits disposed below the sensing electrodes 440 and 450, for example, the first PCB 200 and the main circuit board 30, and to substantially prevent formation of a parasitic capacitance between the sensing electrodes 440 and 450 and other wiring layers 260 of the first PCB 200. The electric potential of the shielding layer 430 may always be maintained at a ground level. The shielding layer 430 may be connected to the ground electrode pad 245 through a contact hole defined at the insulating layer 270 between the lower wiring layer and the outermost wiring layer. The ground electrode pad 245 may always maintain its potential at the ground level.

As illustrated in FIG. 13, the cover layer 250 is disposed on the first PCB 200, and the cover layer 250 is attached to the elastic element 320 using the adhesive layer 322. Accordingly, the display panel 100, the pressure sensor 300, and the first PCB 200 may be attached to each other.

According to an embodiment of the present invention, the sensing electrodes 440 and 450, the sensing electrode connection wirings 443 and 444, the ground electrode pad 245, and the shielding layer 430 may be formed in a substantially same patterning manner as that for forming the wirings disposed at other wiring layers 260. For example, a copper foil is formed on the insulating layer 270, and the shape of the sensing electrodes 440 and 450, the sensing electrode connection wirings 443 and 444, the ground electrode pad 245, and the shielding layer 430 may be formed through a method such as an additive method, a subtractive method, or a semi-additive method. In addition, as described above, the sensing electrodes 440 and 450, the sensing electrode connection wirings 443 and 444, the ground electrode pad 245, and the shielding layer 430 may be formed by applying or printing a conductive paste.

According to an embodiment of the present invention, by forming the sensing electrode of the pressure sensor on the first PCB that is disposed on a back surface of the display panel, and forming the sensing electrode pad and the sensing electrode connection wiring, which connect the sensing electrode and the sensing controller, at an outermost wiring layer of the first PCB, or by forming the sensing electrode of the pressure sensor and the sensing electrode connection wiring, which connects the sensing electrode and the sensing controller, at an outermost wiring layer of the first PCB that is disposed on the back surface of the display panel, a separate FPCB for connecting the pressure sensor and the first PCB may be omitted, and the pressure sensor and the first PCB may be connected to each other more robustly.

In addition, according to an embodiment of the present invention, the conductive sheet, for example, a heat radiation sheet, attached to the back surface of the display panel is used as a conductor of the pressure sensor, and an amount of change in capacitance between the conductive sheet and the sensing electrode disposed on the PCB may be measured. Accordingly, the structure of the pressure sensor may be simplified.

Figure 14A:
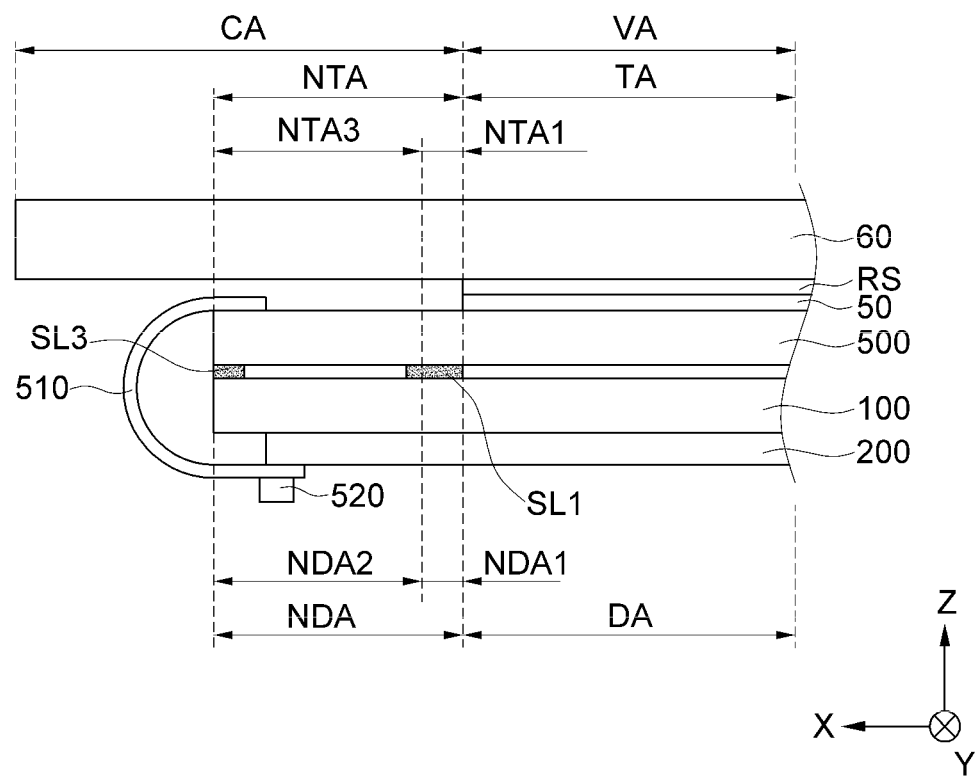
FIG. 14A is a cross-sectional view illustrating a second printed circuit board connecting a first printed circuit board according to an embodiment to a touch sensor disposed on another surface of a display panel.
Figure 14B:
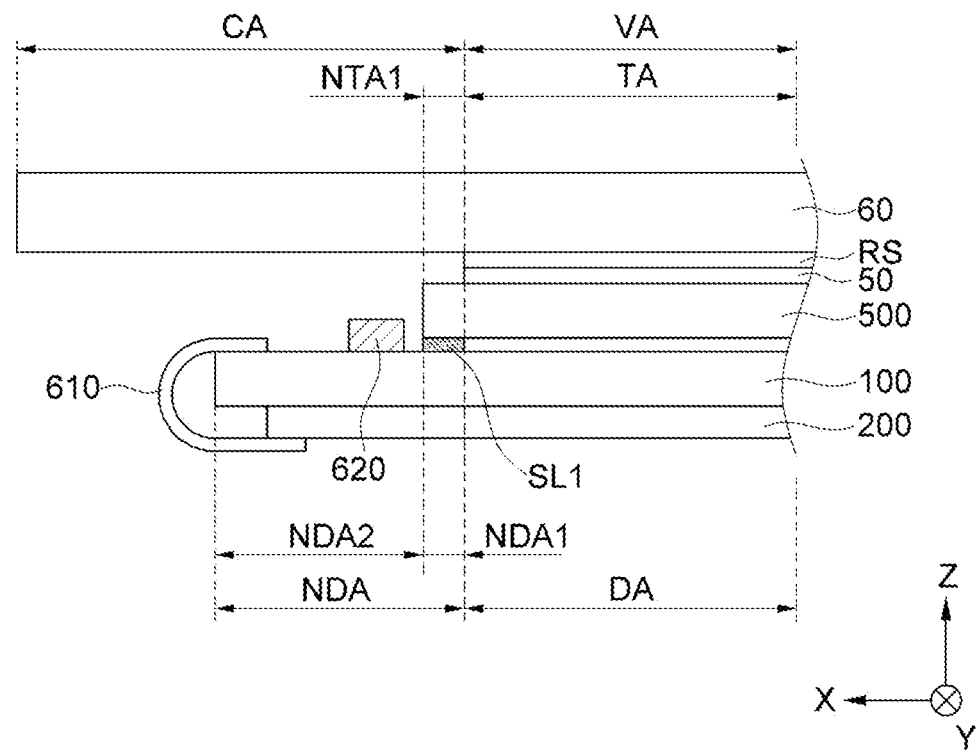
FIG. 14B is a cross-sectional view illustrating a third printed circuit board connecting a first printed circuit board according to an embodiment to an end portion of a display panel.

FIG. 14A is a cross-sectional view illustrating a second printed circuit board connecting a first printed circuit board according to an embodiment of the present invention to a touch sensor disposed on another surface of a display panel. FIG. 14B is a cross-sectional view illustrating a third printed circuit board connecting a first printed circuit board according to an embodiment of the present invention to an end portion of a display panel.

Referring to FIG. 14A, a touch sensor 500 including at least one touch electrode is disposed on another surface of a display panel 100. That is, the touch sensor 500 is disposed between the display panel 100 and a polarization film 50.

The touch sensor 500 may be bonded to the display panel 100. The display panel 100 and the touch sensor 500 may be sealed by sealing members SL1, SL2, and SL3, and may be coupled to each other. The touch sensor 500 may serve as an encapsulation substrate for encapsulating the display panel 100. The sealing members SL1, SL2, and SL3 may have a black color. Accordingly, the sealing members SL1, SL2, and SL3 may be applied on a back surface of the touch sensor 500 along edge portions of first, second, and third non-active areas NTA1, NTA2, and NTA3, respectively. Colors of the sealing members SL1, SL2, and SL3 are not limited. For example, according to another embodiment of the present invention, the sealing members SL1, SL2, and SL3 may include a colorless, transparent material, and may be coated over an entire back surface of a touch substrate to be filled between the display substrate 310 and the touch sensor 500.

An active area TA and a non-active area NTA surrounding the active area TA are defined at the touch sensor 500. The active area TA overlaps the display area DA of the display panel 100, and the non-active area NTA overlaps the non-display area NDA of the display panel 100. That is, the active area TA of the touch sensor 500 overlaps a light transmitting portion VA of the cover window 60, and the non-active area NTA of the touch sensor 500 overlaps a light shielding portion CA of the cover window 60. However, embodiments are not limited thereto. According to another embodiment of the present invention, for example, the active area TA may overlap both the light transmitting portion VA and the light shielding portion CA of the cover window 60.

The touch sensor 500 senses an external touch signal provided to the active area TA. The touch sensor 500 may include a touch cell including touch electrodes for sensing an external touch signal, driving wirings for applying an electrical signal to the touch cell or transmitting an electrical signal generated by the touch cell to the outside, or the like.

The touch signal may be provided in various ways. For example, the touch signal may be provided to the touch sensor 500 through a body part (e.g., a finger) of the user. However, the touch signal is not limited to any one scheme.

According to another embodiment of the present invention, the touch signal may be input in an optical, contact, or magnetic manner.

The touch sensor 500 may sense a touch signal by various methods. For example, the touch sensor 500 may operate in a resistive scheme, a capacitive scheme, or an electromagnetic induction scheme, and may acquire coordinate information of a point where a touch event occurs.

A second PCB 510 electrically connects the touch sensor 500 and the first PCB 200. Herein, the second PCB 510 may be a touch-type FPCB.

A touch driving circuit 520 may be mounted on the second PCB 510.

The second PCB 510 provides an electrical signal to the display panel 100 and receives a touch signal sensed by the touch sensor 500.

The active area TA defined at the touch sensor 500 is disposed at a center portion of the touch sensor 500 in a plan view. A plurality of touch cells may be disposed on the active area TA.

The non-active area NTA includes a first non-active area NTA1, a second non-active area NTA2, and a third non-active area NTA3. The first non-active area NTA1 has a frame shape surrounding the active area TA, and overlaps the display area DA of the display substrate 310.

The second and third non-active areas NTA2 and NTA3 are defined at one side of the touch sensor 500 in a first direction X to overlap a portion of the second non-display area NDA2 of the display panel 100. The second non-active area NTA2 and the third non-active area NTA3 are spaced apart from each other in a second direction Y. For example, the second non-active area NTA2 is defined at one side of the touch sensor 500 in the second direction Y, and the third non-active area NTA3 is defined at another side of the touch sensor 500 in the second direction Y. A plurality of wirings electrically connected to the touch cells may be disposed on the second and third non-active areas NTA2 and NTA3.

Referring to FIG. 14B, a third PCB 610 may be attached to an end portion of the display panel 100. The third PCB 610 may be a FPCB. The third PCB 610 may be a main flexible printed circuit board (M-FPCB).

Opposite end portions of the third PCB 610 are attached to the display panel 100 and the first PCB 200 to electrically connect the display panel 100 and the first PCB 200.

A display panel driving circuit 620 is disposed at an end portion of the display panel 100 and provides a driving signal and an image signal to the display panel 100.

The display panel 100 may include a display substrate, and the display substrate may be a base layer on which the touch sensor 500 is disposed. For example, the display substrate may be an insulating substrate or an insulating film.

The display area DA and the non-display area NDA surrounding the display area DA are defined at the display panel 100. The display area DA overlaps the light transmitting portion VA of the cover window 60, and the non-display area NDA overlaps the light shielding portion CA of the cover window 60.

The display panel 100 displays images at the display area DA. The display panel 100 may include a plurality of pixels. The pixels receive an electrical signal to implement images.

The type of the display panel 100 may be determined according to the characteristics of the display panel 100, that is, the configuration of the pixels of the display panel 100. For example, the display panel 100 according to an embodiment may be an organic light emitting diode (OLED) display panel. However, embodiments of the present invention are not limited to the type of display panel 100. According to another embodiment of the present invention, the display panel 100 may be a liquid crystal display (LCD) panel, an electrophoretic display panel, an electro-wetting display panel, or any one of various display panels capable of displaying images. In addition, the display panel 100 according to an embodiment may include various embodiments, and is not limited to any one embodiment.

Figure 15:
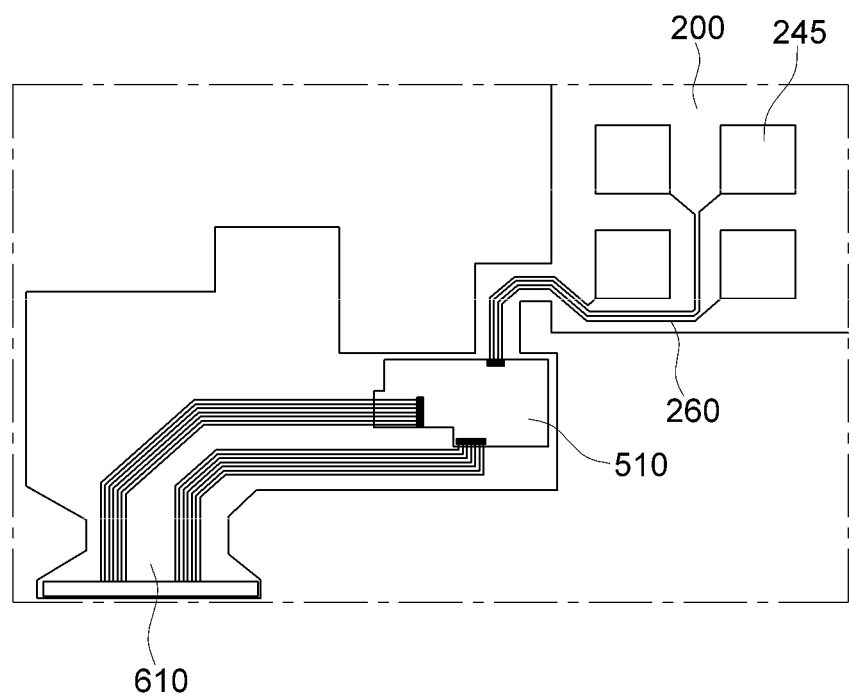
FIG. 15 is a plan view illustrating a first printed circuit board according to an embodiment separated from a second printed circuit board and a third printed circuit board so as not to overlap each other.

In an embodiment of the present invention, as illustrated in FIG. 15, the first PCB 200 is spaced apart from the second PCB 510 or the third PCB 610 so as not to overlap each other. FIG. 15 is a plan view illustrating a first printed circuit board according to an embodiment separated from a second printed circuit board and a third printed circuit board so as not to overlap each other.

The first PCB 200 overlaps an area where the pressure sensor (see 300 of FIG. 3) is disposed. However, the second PCB 510 or the third PCB 610 is located except the area where the pressure sensor is disposed.

The first PCB 200 is connected to the second PCB 510 and the third PCB 610 through the wiring layers 260 located except the area where the pressure sensor is disposed.

Figure 16:
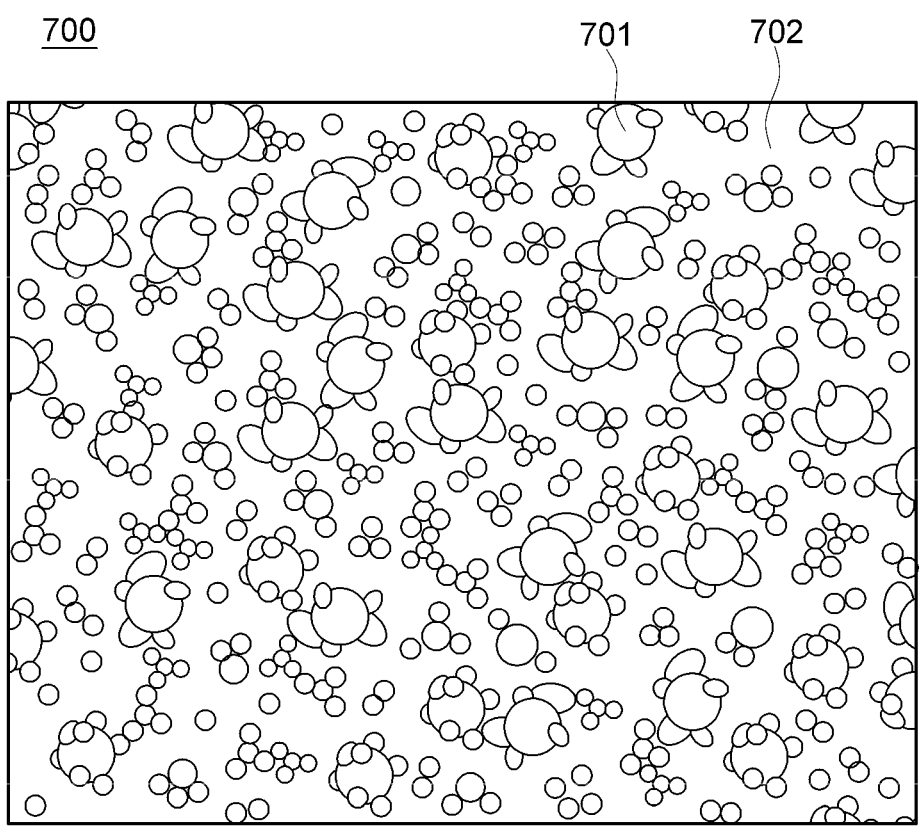
FIG. 16 is a plan view illustrating a second adhesive portion according to an embodiment of the present invention.

FIG. 16 is a plan view illustrating a second adhesive portion according to an embodiment of the present invention.

Referring to FIG. 16, a second adhesive portion 700 according to the embodiment of the present invention may include a filler 701 including particles having a size in a range from about 2 nm to about 500 nm; and a binder 702 for fixing the filler 701.

The filler 701 includes one selected from the group consisting of $BaSO_4$, $TiO_2$, $SiO_2$, and carbon black. The filler 701 may have a size in a range from about 2 nm to about 500 nm, and may have a circular shape, a rod shape, or an irregular shape.

The binder 702 may include one selected from the group consisting of acrylic resins and epoxy resins.

The second adhesive portion 700 is applied by silk imprinting, a deposition process, or the like.

The second adhesive portion 700 may further include a solvent capable of dissolving the binder 702. The solvent is volatilized in a bonding process with the first PCB 200, but may remain partially in the second adhesive portion 700.

The second adhesive portion 700 may improve adhesion with the first PCB 200 by performing a plasma treatment on an upper surface of the second adhesive portion 700.

An adhesive force between the second adhesive portion 700 and the first PCB 200, for examples, the cover layer 250, may have an adhesive force greater than about 1.0 kgf/in to about 3.5 kgf/in. For example, the adhesive force between the second adhesive portion 700 and the first PCB 200 may be in a range from about 1.0 kgf/in to about 4 kgf/in.

Accordingly, the second adhesive portion 700 provides an additional adhesive force to enhance the adhesive force of the first adhesive portions 370 and 375 for bonding the second pad 245 and the second conductor 310 to each other.

A display device according to another embodiment of the present invention may include: the display panel 100; the first PCB 200 disposed at one surface of the display panel 100; the pressure sensor 300 disposed between the display panel 100 and the first PCB 200 and overlapping the first PCB 200; the touch sensor 500 disposed at another surface of the display panel 100; the second PCB 510 connecting the first PCB 200 and the touch sensor 500; and the third PCB 610 connecting the first PCB 200 and the display panel 100.

In such an embodiment, the first PCB 200 overlaps an area where the pressure sensor 300 is disposed, and the second PCB 510 and the third PCB 610 are disposed at an area except the area where the pressure sensor 300 is disposed.

The first PCB 200 includes the first pads 241 and 242 and the second pad 245.

The pressure sensor 300 may include: the elastic member 320 disposed between the display panel 100 and the first PCB 200; the first conductors 340 and 350 disposed between the elastic member 320 and the first PCB 200 and connected to the first pads 241 and 242; and the second conductor 310 disposed between the elastic member 320 and the display panel 100 to form a capacitance with the first conductors 340 and 350.

In addition, the display device may further include: the first adhesive portions 370 and 375 contacting the second pad 245 and the second conductor 310; and the second adhesive portion 700 contacting the second conductor 310 and the first PCB 200.

The second adhesive portion 700 is spaced apart from the first adhesive portions 370 and 375 in a plan view and does not contact the second pad 245.

The first adhesive portions 370 and 375 are conductive tapes or conductive sponges, and the second adhesive portions 700 is a non-conductive tape.

The second adhesive portion 700 has an adhesive force greater than an adhesive force of each of the first adhesive portions 370 and 375.

The first PCB 200 is spaced apart from the second PCB 510 or the third PCB 610 so as not to overlap each other. That is, the first PCB 200 overlaps an area where the pressure sensor 300 is disposed, and the second PCB 510 or the third PCB 610 is located at an area except the area where the pressure sensor 300 is disposed.

The first PCB 200 is electrically connected to the second PCB 510 and the third PCB 610 through the wiring layers 260 located at an area except the area where the pressure sensor 300 is disposed.

As described above, although embodiments of the present invention have been described with reference to the accompanying drawings, it will be appreciated by those skilled in the art to which the present invention pertains that the present invention may be embodied in other specific forms without changing the technical spirit or essential features of the present invention. Accordingly, it should be understood that the embodiments described above are exemplary in all respects and not restrictive.

As described above, according to the present invention, a display device of an all-in-one force touch type in which the force touch sensors are printed on the display panel, without using a sensor sheet that takes up thickness, may be implemented, thereby strengthening the connection between the PCB and the force touch sensor.

As set forth hereinabove, according to one or more embodiments, when a pressure according to a force touch of the user is applied to a connection portion between a pressure sensor and a printed circuit board, a conductive tape attached to a sensor electrode may be substantially prevented from being detached from the printed circuit board due to a second adhesive portion that attaches the pressure sensor to the printed circuit board.

Accordingly, a connection between a force touch sensor and the printed circuit board may be strengthened by the second adhesive portion.

In addition, by printing the force touch sensors to the display panel, without using a sensor sheet that takes up thickness, the thickness of the display device may be reduced and the material costs may be reduced.

In addition, by forming the sensing electrode of the pressure sensor on the printed circuit board that is disposed on a back surface of the display panel, a separate flexible printed circuit board for connecting the pressure sensor and the printed circuit board may be omitted, and thus the pressure sensor and the printed circuit board may be connected to each other more robustly.

While the present invention has been illustrated and described with reference to the embodiments thereof, it will be apparent to those of ordinary skill in the art that various changes in form and detail may be made thereto without departing from the spirit and scope of the present invention as defined by the following claims and equivalents thereof.

What is claimed is:

1. A display device comprising:
    a display panel;
    a first printed circuit board over one surface of the display panel and comprising a first pad and a second pad;
    a pressure sensor between the display panel and the first printed circuit board, the pressure sensor comprising a first conductor connected to the first pad, and a second conductor forming a capacitance with the first conductor;
    a first adhesive portion directly contacting the second pad and the second conductor; and
    a second adhesive portion contacting the second conductor and the first printed circuit board.

2. The display device of claim 1, wherein the pressure sensor comprises an elastic member between the display panel and the first printed circuit board,
    wherein the first conductor is between the elastic member and the first printed circuit board, and
    wherein the second conductor is between the elastic member and the display panel.

3. The display device of claim 1, wherein the second adhesive portion is spaced apart from the first adhesive portion in a plan view.

4. The display device of claim 1, wherein the second adhesive portion does not contact the second pad.

5. The display device of claim 1, wherein the first adhesive portion is a conductive tape, and the second adhesive portion is a non-conductive tape.

6. The display device of claim 1, wherein the first adhesive portion comprises a conductive sponge contacting the second pad and the second conductor.

7. The display device of claim 1, wherein the second adhesive portion has an adhesive force greater than an adhesive force of the first adhesive portion.

8. The display device of claim 7, wherein an adhesive force between the second adhesive portion and the second conductor is greater than an adhesive force between the first adhesive portion and the second conductor.

9. The display device of claim 1, wherein the first adhesive portion contacts the second pad, and the second adhesive portion contacts a cover layer of the first printed circuit board.

10. The display device of claim 1, wherein the second adhesive portion has a c-like shape around the first adhesive portion on a plane.

11. The display device of claim 1, wherein the first printed circuit board comprises a wiring pad and is connected to the display panel through the wiring pad.

12. The display device of claim 1, further comprising:
    a touch sensor comprising at least one touch electrode over another surface of the display panel;
    a second printed circuit board connecting the touch sensor and the first printed circuit board; and
    a touch driving circuit mounted over the second printed circuit board.

13. The display device of claim 12, wherein the first printed circuit board is separated from the second printed circuit board so as not to overlap the first printed circuit board.

14. The display device of claim 1, further comprising:
    a third printed circuit board attached to an end portion of the display panel; and
    a display panel driving circuit at an end portion of the display panel and providing a driving signal and an image signal to the display panel.

15. The display device of claim 14, wherein the first printed circuit board is separated from the third printed circuit board so as not to overlap the first printed circuit board.

16. The display device of claim 15, wherein the first printed circuit board overlaps an area where the pressure sensor is located.

17. The display device of claim 15, wherein the third printed circuit board is located at an area other than where the pressure sensor is located.

18. The display device of claim 15, wherein the first printed circuit board is connected to the third printed circuit board through a wiring layer located at an area other than where the pressure sensor is located.

19. The display device of claim 1, wherein the second adhesive portion comprises:
    a filler comprising particles having a size of about 2 nm to about 500 nm; and
    a binder for fixing the filler.

20. The display device of claim 19, wherein the filler comprises at least one selected from the group consisting of $BaSO_4$, $TiO_2$, $SiO_2$, and carbon black.

21. The display device of claim 19, wherein the binder comprises at least one selected from the group consisting of acrylic resins and epoxy resins.

22. The display device of claim 1, wherein the second adhesive portion has an adhesive force in a range from about 1.0 kgf/in to 3.0 kgf/in.

23. The display device of claim 1, wherein the second adhesive portion partially encloses both of the first adhesive portion and the second pad in a plan view.

24. A display device comprising:
    a display panel;
    a first printed circuit board over one surface of the display panel;
    a pressure sensor between the display panel and the first printed circuit board, the pressure sensor overlapping the first printed circuit board;
    a touch sensor over another surface of the display panel;
    a second printed circuit board connecting the first printed circuit board and the touch sensor; and
    a third printed circuit board connecting the first printed circuit board and the display panel,
    wherein the first printed circuit board overlaps an area where the pressure sensor is located,
    wherein the second printed circuit board and the third printed circuit board are located at an area other than where the pressure sensor is located, and
    wherein the first printed circuit board on which the pressure sensor is disposed is spaced apart from the second and third printed circuit boards in a plan view.

25. The display device of claim 24, wherein the first printed circuit board comprises a first pad and a second pad, and
    wherein the pressure sensor comprises:

an elastic member between the display panel and the first printed circuit board;
a first conductor between the elastic member and the first printed circuit board and connected to the first pad; and
a second conductor between the elastic member and the display panel and forming a capacitance with the first conductor.

26. The display device of claim 25, further comprising a first adhesive portion contacting the second pad and the second conductor.

27. The display device of claim 26, further comprising a second adhesive portion contacting the second conductor and the first printed circuit board.

* * * * *